United States Patent
Wober

(10) Patent No.: US 9,429,723 B2
(45) Date of Patent: Aug. 30, 2016

(54) OPTICAL WAVEGUIDES IN IMAGE SENSORS

(75) Inventor: Munib Wober, Topsfield, MA (US)

(73) Assignee: ZENA TECHNOLOGIES, INC., Cambridge, MA (US)

( * ) Notice: Subject to any disclaimer, the term of this patent is extended or adjusted under 35 U.S.C. 154(b) by 0 days.

(21) Appl. No.: 13/556,041

(22) Filed: Jul. 23, 2012

(65) Prior Publication Data

US 2013/0020620 A1 Jan. 24, 2013

Related U.S. Application Data

(63) Continuation of application No. 12/648,942, filed on Dec. 29, 2009, now Pat. No. 8,229,255, which is a continuation-in-part of application No. 12/204,686, filed on Sep. 4, 2008, now Pat. No. 7,646,943.

(51) Int. Cl.
*G02B 6/00* (2006.01)
*G02B 6/42* (2006.01)
*G02B 6/43* (2006.01)
(Continued)

(52) U.S. Cl.
CPC ............. *G02B 6/4204* (2013.01); *G02B 6/421* (2013.01); *G02B 6/43* (2013.01); *H01L 27/14627* (2013.01); *H01L 27/14685* (2013.01); *H04N 5/374* (2013.01)

(58) Field of Classification Search
CPC ...... G02B 6/4204; G02B 6/421; G02B 6/43; H01L 27/14627; H01L 27/14685; H04N 5/374
USPC .......................................................... 385/12
See application file for complete search history.

(56) References Cited

U.S. PATENT DOCUMENTS 1,918,848 A 7/1933 Land
3,903,427 A 9/1975 Pack
(Continued)

FOREIGN PATENT DOCUMENTS

CN 1624925 6/2005
CN 1306619 3/2007
(Continued)

OTHER PUBLICATIONS

Kalkofen et al., Atomic layer deposition of boron oxide as dopant source for shallow doping of silicon, Meeting Abstract 943, 217$^{th}$ ECS Meeting, 2010, available at http://ma.ecsdl.org/content/MA2010-01/17/943.full.pdf.*
(Continued)

*Primary Examiner* — Peter Radkowski
(74) *Attorney, Agent, or Firm* — Pillsbury Winthrop Shaw Pittman LLP

(57) ABSTRACT

An embodiment relates to an image sensor comprising (a) a optical pipe comprising a core and a cladding, and (b) a pair of photosensitive elements comprising a central photosensitive element and a peripheral photosensitive element, wherein the central photosensitive element is operably coupled to the core and the peripheral photosensitive element is operably coupled to the cladding, and methods of fabricating and using the same. The image sensor could further comprise a lens structure or an optical coupler or an optical coupler over the optical pipe, wherein the lens structure or the optical coupler or the optical coupler is operably coupled to the optical pipe.

30 Claims, 9 Drawing Sheets

(A)

(B)

(51) Int. Cl.
*H01L 27/146* (2006.01)
*H04N 5/374* (2011.01)

(56) References Cited

U.S. PATENT DOCUMENTS

| | | | |
|---|---|---|---|
| 4,017,332 A | 4/1977 | James | |
| 4,292,512 A | 9/1981 | Miller | |
| 4,316,048 A | 2/1982 | Woodall | |
| 4,357,415 A | 11/1982 | Hartman | |
| 4,387,265 A | 6/1983 | Dalal | |
| 4,394,571 A | 7/1983 | Jurisson | |
| 4,400,221 A | 8/1983 | Rahilly | |
| 4,443,890 A | 4/1984 | Eumurian | |
| 4,513,168 A | 4/1985 | Borden | |
| 4,531,055 A | 7/1985 | Shepherd, Jr. | |
| 4,620,237 A * | 10/1986 | Traino et al. | 358/300 |
| 4,678,772 A | 7/1987 | Segal et al. | |
| 4,827,335 A | 5/1989 | Saito | |
| 4,846,556 A | 7/1989 | Haneda | |
| 4,857,973 A | 8/1989 | Yang | |
| 4,876,586 A | 10/1989 | Dyck | |
| 4,880,613 A | 11/1989 | Satoh | |
| 4,896,941 A | 1/1990 | Hayashi | |
| 4,950,625 A | 8/1990 | Nakashima | |
| 4,971,928 A | 11/1990 | Fuller | |
| 4,972,244 A | 11/1990 | Buffet | |
| 4,990,988 A | 2/1991 | Lin | |
| 5,071,490 A | 12/1991 | Yokota | |
| 5,081,049 A | 1/1992 | Green | |
| 5,096,520 A | 3/1992 | Faris | |
| 5,124,543 A | 6/1992 | Kawashima | |
| 5,217,911 A | 6/1993 | Denda | |
| 5,247,349 A | 9/1993 | Olego | |
| 5,272,518 A | 12/1993 | Vincent | |
| 5,311,047 A | 5/1994 | Chang | |
| 5,347,147 A | 9/1994 | Jones | |
| 5,362,972 A | 11/1994 | Yazawa | |
| 5,374,841 A * | 12/1994 | Goodwin | 257/442 |
| 5,391,896 A | 2/1995 | Wanlass | |
| 5,401,968 A | 3/1995 | Cox | |
| 5,449,626 A | 9/1995 | Hezel | |
| 5,468,652 A | 11/1995 | Gee | |
| 5,602,661 A | 2/1997 | Schadt | |
| 5,612,780 A | 3/1997 | Rickenbach | |
| 5,671,914 A * | 9/1997 | Kalkhoran et al. | 257/77 |
| 5,696,863 A | 12/1997 | Kleinerman | |
| 5,723,945 A | 3/1998 | Schermerhorn | |
| 5,747,796 A | 5/1998 | Heard | |
| 5,767,507 A | 6/1998 | Unul | |
| 5,798,535 A | 8/1998 | Huang | |
| 5,844,290 A * | 12/1998 | Furumiya | 257/432 |
| 5,853,446 A | 12/1998 | Carre | |
| 5,857,053 A * | 1/1999 | Kane | 385/127 |
| 5,877,492 A | 3/1999 | Fujieda | |
| 5,880,495 A | 3/1999 | Chen | |
| 5,885,881 A | 3/1999 | Ojha | |
| 5,900,623 A | 5/1999 | Tsang | |
| 5,943,463 A | 8/1999 | Unuma | |
| 5,968,528 A | 10/1999 | Deckner et al. | |
| 6,013,871 A | 1/2000 | Curtin | |
| 6,033,582 A | 3/2000 | Lee | |
| 6,037,243 A | 3/2000 | Ha | |
| 6,046,466 A | 4/2000 | Ishida | |
| 6,074,892 A | 6/2000 | Bowers | |
| 6,100,551 A | 8/2000 | Lee | |
| 6,270,548 B1 | 8/2001 | Campbell | |
| 6,301,420 B1 * | 10/2001 | Greenaway et al. | 385/126 |
| 6,326,649 B1 | 12/2001 | Chang | |
| 6,388,243 B1 | 5/2002 | Berezin | |
| 6,388,648 B1 | 5/2002 | Clifton | |
| 6,407,439 B1 * | 6/2002 | Hier et al. | 257/440 |
| 6,459,034 B2 | 10/2002 | Muramoto | |
| 6,463,204 B1 * | 10/2002 | Ati | 385/147 |
| 6,542,231 B1 | 4/2003 | Garrett | |
| 6,563,995 B2 * | 5/2003 | Kane et al. | 385/127 |
| 6,566,723 B1 | 5/2003 | Vook | |
| 6,680,216 B2 | 1/2004 | Kwasnick | |
| 6,709,929 B2 | 3/2004 | Zhang | |
| 6,720,594 B2 | 4/2004 | Rahn | |
| 6,771,314 B1 | 8/2004 | Bawolek | |
| 6,805,139 B1 | 10/2004 | Savas | |
| 6,812,473 B1 | 11/2004 | Amemiya | |
| 6,904,187 B2 | 6/2005 | Fischer et al. | |
| 6,927,145 B1 | 8/2005 | Yang | |
| 6,960,526 B1 | 11/2005 | Shah | |
| 6,967,120 B2 | 11/2005 | Jang | |
| 6,969,899 B2 | 11/2005 | Yaung | |
| 6,987,258 B2 | 1/2006 | Mates | |
| 6,996,147 B2 | 2/2006 | Majumdar | |
| 7,052,927 B1 | 5/2006 | Fletcher | |
| 7,064,372 B2 | 6/2006 | Duan | |
| 7,105,428 B2 | 9/2006 | Pan | |
| 7,106,938 B2 | 9/2006 | Baek et al. | |
| 7,109,517 B2 | 9/2006 | Zaidi | |
| 7,153,720 B2 | 12/2006 | Augusto | |
| 7,163,659 B2 | 1/2007 | Stasiak | |
| 7,192,533 B2 | 3/2007 | Bakkers | |
| 7,208,783 B2 | 4/2007 | Palsule | |
| 7,230,286 B2 | 6/2007 | Cohen | |
| 7,235,475 B2 | 6/2007 | Kamins | |
| 7,241,434 B2 | 7/2007 | Anthony | |
| 7,253,017 B1 | 8/2007 | Roscheisen | |
| 7,254,151 B2 | 8/2007 | Lieber | |
| 7,262,400 B2 | 8/2007 | Yaung | |
| 7,265,328 B2 | 9/2007 | Mouli | |
| 7,272,287 B2 * | 9/2007 | Bise et al. | 385/123 |
| 7,285,812 B2 | 10/2007 | Tang | |
| 7,306,963 B2 | 12/2007 | Linden | |
| 7,307,327 B2 | 12/2007 | Bahl | |
| 7,311,889 B2 | 12/2007 | Awano | |
| 7,326,915 B2 | 2/2008 | Kaluzhny | |
| 7,330,404 B2 | 2/2008 | Peng | |
| 7,335,962 B2 | 2/2008 | Mouli | |
| 7,336,860 B2 | 2/2008 | Cyr | |
| 7,358,583 B2 | 4/2008 | Reznik | |
| 7,381,966 B2 | 6/2008 | Starikov | |
| 7,388,147 B2 | 6/2008 | Mulligan | |
| 7,416,911 B2 | 8/2008 | Heath et al. | |
| 7,446,025 B2 | 11/2008 | Cohen | |
| 7,462,774 B2 | 12/2008 | Roscheisen | |
| 7,471,428 B2 | 12/2008 | Ohara | |
| 7,491,269 B2 | 2/2009 | Legagneux | |
| 7,507,293 B2 | 3/2009 | Li | |
| 7,521,322 B2 | 4/2009 | Tang | |
| 7,524,694 B2 * | 4/2009 | Adkisson et al. | 438/57 |
| 7,582,857 B2 | 9/2009 | Gruev | |
| 7,598,482 B1 | 10/2009 | Verhulst | |
| 7,622,367 B1 | 11/2009 | Nuzzo | |
| 7,626,685 B2 | 12/2009 | Jin | |
| 7,646,138 B2 | 1/2010 | Williams | |
| 7,646,943 B1 | 1/2010 | Wober | |
| 7,647,695 B2 | 1/2010 | MacNutt | |
| 7,649,665 B2 | 1/2010 | Kempa et al. | |
| 7,655,860 B2 | 2/2010 | Parsons | |
| 7,663,202 B2 | 2/2010 | Wang | |
| 7,692,860 B2 | 4/2010 | Sato et al. | |
| 7,704,806 B2 | 4/2010 | Chae | |
| 7,713,779 B2 | 5/2010 | Firon | |
| 7,719,678 B2 | 5/2010 | Kamins | |
| 7,719,688 B2 | 5/2010 | Kamins | |
| 7,732,769 B2 | 6/2010 | Snider | |
| 7,732,839 B2 | 6/2010 | Sebe | |
| 7,736,954 B2 | 6/2010 | Hussain | |
| 7,740,824 B2 | 6/2010 | Godfried | |
| 7,790,495 B2 | 9/2010 | Assefa | |
| 7,888,155 B2 | 2/2011 | Chen | |
| 7,902,540 B2 | 3/2011 | Cohen | |
| 7,948,555 B2 | 5/2011 | Kwon et al. | |
| 8,030,729 B2 | 10/2011 | Quitoriano | |
| 8,035,184 B1 | 10/2011 | Dutta | |
| 8,049,203 B2 | 11/2011 | Samuelson | |
| 8,063,450 B2 | 11/2011 | Wernersson | |
| 8,067,299 B2 | 11/2011 | Samuelson | |
| 8,067,736 B2 | 11/2011 | Gruss | |

(56) References Cited

U.S. PATENT DOCUMENTS

| | | |
|---|---|---|
| 8,084,728 B2 | 12/2011 | Tsang |
| 8,093,675 B2 | 1/2012 | Tsunemi |
| 8,118,170 B2 | 2/2012 | Sato |
| 8,143,658 B2 | 3/2012 | Samuelson |
| 8,154,127 B1 | 4/2012 | Kamins |
| 8,193,524 B2 | 6/2012 | Bjoerk |
| 8,208,776 B2 | 6/2012 | Tokushima |
| 8,212,136 B2 | 7/2012 | Shirai |
| 8,212,138 B2 | 7/2012 | Landis |
| 8,222,705 B2 | 7/2012 | Ogino |
| 8,242,353 B2 | 8/2012 | Karg |
| 8,269,985 B2 | 9/2012 | Wober |
| 8,274,039 B2 | 9/2012 | Wober |
| 8,299,472 B2 | 10/2012 | Yu et al. |
| 8,330,090 B2 | 12/2012 | Agarwal |
| 8,384,007 B2 | 2/2013 | Yu et al. |
| 8,455,857 B2 | 6/2013 | Samuelson |
| 8,471,190 B2 | 6/2013 | Wober |
| 8,546,742 B2 | 10/2013 | Wober |
| 8,766,272 B2 | 7/2014 | Yu et al. |
| 8,791,470 B2 | 7/2014 | Wober |
| 8,810,808 B2 | 8/2014 | Wober |
| 8,835,831 B2 | 9/2014 | Yu |
| 2002/0003201 A1* | 1/2002 | Yu .................. 250/208.1 |
| 2002/0020846 A1 | 2/2002 | Pi |
| 2002/0021879 A1 | 2/2002 | Lee |
| 2002/0071468 A1 | 6/2002 | Sandstrom |
| 2002/0104821 A1 | 8/2002 | Bazylenko |
| 2002/0109082 A1 | 8/2002 | Nakayama |
| 2002/0117675 A1 | 8/2002 | Mascarenhas |
| 2002/0130311 A1* | 9/2002 | Lieber et al. ............ 257/1 |
| 2002/0172820 A1* | 11/2002 | Majumdar et al. ......... 428/357 |
| 2003/0003300 A1 | 1/2003 | Korgel |
| 2003/0006363 A1 | 1/2003 | Campbell |
| 2003/0077907 A1 | 4/2003 | Kao |
| 2003/0089899 A1 | 5/2003 | Lieber |
| 2003/0103744 A1 | 6/2003 | Koyama |
| 2003/0132480 A1 | 7/2003 | Chau |
| 2003/0160176 A1 | 8/2003 | Vispute |
| 2003/0189202 A1 | 10/2003 | Li |
| 2003/0227090 A1 | 12/2003 | Okabe |
| 2004/0011975 A1 | 1/2004 | Nicoli |
| 2004/0021062 A1 | 2/2004 | Zaidi |
| 2004/0021602 A1 | 2/2004 | Zaidi |
| 2004/0026684 A1 | 2/2004 | Empedocles |
| 2004/0058058 A1 | 3/2004 | Shchegolikhin |
| 2004/0065362 A1 | 4/2004 | Watabe |
| 2004/0075464 A1 | 4/2004 | Samuelson |
| 2004/0095658 A1 | 5/2004 | Buretea et al. |
| 2004/0109666 A1 | 6/2004 | Kim |
| 2004/0114847 A1 | 6/2004 | Fischer et al. |
| 2004/0118337 A1 | 6/2004 | Mizutani |
| 2004/0118377 A1 | 6/2004 | Bloms |
| 2004/0122328 A1 | 6/2004 | Wang |
| 2004/0124366 A1 | 7/2004 | Zeng |
| 2004/0155247 A1 | 8/2004 | Benthien |
| 2004/0156610 A1 | 8/2004 | Charlton et al. |
| 2004/0160522 A1 | 8/2004 | Fossum |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block |
| 2004/0241965 A1 | 12/2004 | Merritt |
| 2004/0252957 A1 | 12/2004 | Schmidt et al. |
| 2004/0261840 A1 | 12/2004 | Schmit |
| 2005/0009224 A1 | 1/2005 | Yang |
| 2005/0035381 A1 | 2/2005 | Holm |
| 2005/0082676 A1 | 4/2005 | Andry |
| 2005/0087601 A1* | 4/2005 | Gerst et al. ............ 235/455 |
| 2005/0095699 A1 | 5/2005 | Miyauchi |
| 2005/0109388 A1 | 5/2005 | Murakami |
| 2005/0116271 A1 | 6/2005 | Kato |
| 2005/0133476 A1 | 6/2005 | Islam |
| 2005/0161662 A1 | 7/2005 | Majumdar et al. |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0224707 A1 | 10/2005 | Guedj |
| 2005/0242409 A1* | 11/2005 | Yang et al. .................. 257/428 |
| 2005/0284517 A1 | 12/2005 | Shinohara |
| 2006/0011362 A1 | 1/2006 | Tao |
| 2006/0038990 A1 | 2/2006 | Habib et al. |
| 2006/0113622 A1 | 6/2006 | Adkisson |
| 2006/0115230 A1 | 6/2006 | Komoguchi et al. |
| 2006/0121371 A1 | 6/2006 | Wu |
| 2006/0146323 A1 | 7/2006 | Bratkovski |
| 2006/0162766 A1 | 7/2006 | Gee |
| 2006/0180197 A1 | 8/2006 | Gui |
| 2006/0208320 A1 | 9/2006 | Tsuchiya et al. |
| 2006/0257071 A1* | 11/2006 | Bise et al. ............ 385/29 |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012980 A1 | 1/2007 | Duan |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1* | 4/2007 | Tennant .................. 365/185.14 |
| 2007/0082255 A1 | 4/2007 | Sun |
| 2007/0099292 A1 | 5/2007 | Miller |
| 2007/0104441 A1 | 5/2007 | Ahn |
| 2007/0107773 A1 | 5/2007 | Fork |
| 2007/0108371 A1 | 5/2007 | Stevens |
| 2007/0114622 A1 | 5/2007 | Adkisson |
| 2007/0120254 A1 | 5/2007 | Hurkx et al. |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1* | 6/2007 | Adkisson et al. ........ 250/227.11 |
| 2007/0138459 A1 | 6/2007 | Wong |
| 2007/0139740 A1* | 6/2007 | Igura et al. .................. 358/518 |
| 2007/0140638 A1* | 6/2007 | Yang et al. .................. 385/132 |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0164270 A1 | 7/2007 | Majumdar |
| 2007/0170418 A1 | 7/2007 | Bowers |
| 2007/0172623 A1 | 7/2007 | Kresse |
| 2007/0187787 A1* | 8/2007 | Ackerson et al. ............ 257/428 |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya |
| 2007/0238265 A1 | 10/2007 | Kurashina |
| 2007/0238285 A1 | 10/2007 | Borden |
| 2007/0241260 A1* | 10/2007 | Jaeger et al. ............ 250/214.1 |
| 2007/0246689 A1 | 10/2007 | Ge |
| 2007/0248958 A1 | 10/2007 | Jovanovich |
| 2007/0272828 A1 | 11/2007 | Xu |
| 2007/0278500 A1 | 12/2007 | Lin |
| 2007/0285378 A1 | 12/2007 | Lankhorst |
| 2007/0290193 A1 | 12/2007 | Tucker |
| 2007/0290265 A1 | 12/2007 | Augusto |
| 2008/0001498 A1 | 1/2008 | Muller |
| 2008/0006319 A1 | 1/2008 | Bettge |
| 2008/0029701 A1 | 2/2008 | Onozawa |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar |
| 2008/0055451 A1 | 3/2008 | Kanbe |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu |
| 2008/0088014 A1 | 4/2008 | Adkisson |
| 2008/0090401 A1 | 4/2008 | Bratkovski |
| 2008/0092938 A1 | 4/2008 | Majumdar |

(56) References Cited

U.S. PATENT DOCUMENTS

| | | |
|---|---|---|
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0145965 A1 | 6/2008 | Reznik |
| 2008/0149914 A1 | 6/2008 | Samuelson et al. |
| 2008/0149944 A1 | 6/2008 | Samuelson |
| 2008/0157253 A1 | 7/2008 | Starikov |
| 2008/0166883 A1 | 7/2008 | Liu |
| 2008/0169017 A1 | 7/2008 | Korevaar |
| 2008/0169019 A1 | 7/2008 | Korevaar |
| 2008/0173615 A1 | 7/2008 | Kim |
| 2008/0178924 A1 | 7/2008 | Kempa |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1 | 10/2008 | Szu |
| 2008/0264478 A1 | 10/2008 | Ahn |
| 2008/0266556 A1 | 10/2008 | Kamins |
| 2008/0266572 A1 | 10/2008 | Kamins |
| 2008/0271783 A1 | 11/2008 | Murakami |
| 2008/0277646 A1 | 11/2008 | Kim et al. |
| 2008/0283728 A1* | 11/2008 | Inoue ................. 250/208.1 |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwar |
| 2009/0001498 A1 | 1/2009 | Wang |
| 2009/0020150 A1 | 1/2009 | Atwater |
| 2009/0020687 A1 | 1/2009 | Lehmann et al. |
| 2009/0032687 A1 | 2/2009 | Lapstun |
| 2009/0046362 A1 | 2/2009 | Guo |
| 2009/0046749 A1 | 2/2009 | Mizuuchi |
| 2009/0050204 A1 | 2/2009 | Habib |
| 2009/0052029 A1 | 2/2009 | Dai et al. |
| 2009/0057650 A1 | 3/2009 | Lieber |
| 2009/0072145 A1 | 3/2009 | Peczalski et al. |
| 2009/0104160 A1 | 4/2009 | Young |
| 2009/0120498 A1 | 5/2009 | Yamazaki |
| 2009/0121136 A1 | 5/2009 | Gruss et al. |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0153961 A1 | 6/2009 | Murakami et al. |
| 2009/0165844 A1 | 7/2009 | Dutta |
| 2009/0173976 A1 | 7/2009 | Augusto |
| 2009/0179225 A1 | 7/2009 | Fertig et al. |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Wang |
| 2009/0194160 A1 | 8/2009 | Chin |
| 2009/0199597 A1 | 8/2009 | Danley |
| 2009/0201400 A1 | 8/2009 | Zhang |
| 2009/0206405 A1 | 8/2009 | Doyle |
| 2009/0223558 A1 | 9/2009 | Sun |
| 2009/0224245 A1 | 9/2009 | Umezaki |
| 2009/0224349 A1* | 9/2009 | Gambino et al. ............ 257/432 |
| 2009/0230039 A1 | 9/2009 | Hoenig et al. |
| 2009/0233445 A1 | 9/2009 | Lee |
| 2009/0242018 A1 | 10/2009 | Ahn |
| 2009/0243016 A1 | 10/2009 | Kawahara |
| 2009/0244514 A1 | 10/2009 | Jin |
| 2009/0260687 A1 | 10/2009 | Park |
| 2009/0261438 A1 | 10/2009 | Choi |
| 2009/0266418 A1 | 10/2009 | Hu et al. |
| 2009/0266974 A1 | 10/2009 | Verhulst |
| 2009/0272423 A1 | 11/2009 | Niira |
| 2009/0278998 A1 | 11/2009 | El-Ghoroury |
| 2009/0289320 A1 | 11/2009 | Cohen |
| 2009/0305454 A1 | 12/2009 | Cohen |
| 2010/0006817 A1 | 1/2010 | Ohlsson |
| 2010/0019252 A1 | 1/2010 | Bratkovski |
| 2010/0019296 A1 | 1/2010 | Cha |
| 2010/0019355 A1 | 1/2010 | Kamins |
| 2010/0025710 A1 | 2/2010 | Yamada |
| 2010/0078055 A1 | 4/2010 | Vidu |
| 2010/0090341 A1 | 4/2010 | Wan |
| 2010/0101633 A1 | 4/2010 | Park |
| 2010/0104494 A1 | 4/2010 | Meng |
| 2010/0110433 A1 | 5/2010 | Nedelcu et al. |
| 2010/0116976 A1 | 5/2010 | Wober |
| 2010/0126573 A1 | 5/2010 | Youtsey |
| 2010/0127153 A1 | 5/2010 | Agarwal |
| 2010/0132779 A1 | 6/2010 | Hong |
| 2010/0133986 A1 | 6/2010 | Kim |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0178018 A1 | 7/2010 | Augusto |
| 2010/0186809 A1 | 7/2010 | Samuelson et al. |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke |
| 2010/0244169 A1 | 9/2010 | Maeda |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0277607 A1* | 11/2010 | Choi et al. ................. 348/222.1 |
| 2010/0282314 A1 | 11/2010 | Coakley |
| 2010/0295019 A1* | 11/2010 | Wang et al. ..................... 257/21 |
| 2010/0302440 A1 | 12/2010 | Wober |
| 2010/0304061 A1 | 12/2010 | Ye |
| 2010/0308214 A1 | 12/2010 | Wober |
| 2010/0313952 A1 | 12/2010 | Coakley |
| 2010/0319763 A1 | 12/2010 | Park |
| 2010/0320444 A1 | 12/2010 | Dutta |
| 2011/0018424 A1 | 1/2011 | Takada |
| 2011/0036396 A1 | 2/2011 | Jayaraman |
| 2011/0037133 A1 | 2/2011 | Su |
| 2011/0049572 A1 | 3/2011 | Jeon et al. |
| 2011/0050042 A1 | 3/2011 | Choi et al. |
| 2011/0057231 A1 | 3/2011 | Jeon et al. |
| 2011/0057234 A1 | 3/2011 | Jeon et al. |
| 2011/0057286 A1 | 3/2011 | Jeon et al. |
| 2011/0080508 A1 | 4/2011 | Katsuno |
| 2011/0084212 A1 | 4/2011 | Clark |
| 2011/0127490 A1 | 6/2011 | Mi |
| 2011/0133060 A1 | 6/2011 | Yu |
| 2011/0133160 A1 | 6/2011 | Yui |
| 2011/0135814 A1 | 6/2011 | Miyauchi |
| 2011/0139176 A1 | 6/2011 | Cheung |
| 2011/0146771 A1 | 6/2011 | Chuang et al. |
| 2011/0147870 A1 | 6/2011 | Ang |
| 2011/0180894 A1 | 7/2011 | Samuelson |
| 2011/0195577 A1 | 8/2011 | Kushibiki |
| 2011/0220191 A1 | 9/2011 | Flood |
| 2011/0226937 A1 | 9/2011 | Yu |
| 2011/0248315 A1 | 10/2011 | Nam |
| 2011/0249219 A1 | 10/2011 | Evans |
| 2011/0249322 A1 | 10/2011 | Wang |
| 2011/0253982 A1 | 10/2011 | Wang |
| 2011/0272014 A1 | 11/2011 | Mathai |
| 2011/0297214 A1 | 12/2011 | Kim |
| 2011/0309237 A1 | 12/2011 | Seo |
| 2011/0309240 A1 | 12/2011 | Yu |

(56) References Cited

U.S. PATENT DOCUMENTS

| | | |
|---|---|---|
| 2011/0309331 A1 | 12/2011 | Yu |
| 2011/0315988 A1 | 12/2011 | Yu |
| 2011/0316106 A1 | 12/2011 | Kim |
| 2012/0006390 A1 | 1/2012 | Huo et al. |
| 2012/0009714 A1 | 1/2012 | Mouli |
| 2012/0014837 A1 | 1/2012 | Fehr et al. |
| 2012/0029328 A1 | 2/2012 | Shimizu |
| 2012/0031454 A1 | 2/2012 | Fogel |
| 2012/0060905 A1 | 3/2012 | Fogel |
| 2012/0075513 A1 | 3/2012 | Chipman et al. |
| 2012/0153124 A1 | 6/2012 | Yu |
| 2012/0192939 A1 | 8/2012 | Tamboli et al. |
| 2012/0196383 A1 | 8/2012 | Nitkowski et al. |
| 2012/0196401 A1 | 8/2012 | Graham |
| 2012/0240999 A1 | 9/2012 | Yoshida |
| 2012/0258563 A1 | 10/2012 | Ogino |
| 2012/0280345 A1 | 11/2012 | Zhu |
| 2012/0298843 A1 | 11/2012 | Yu |
| 2012/0313078 A1 | 12/2012 | Fukui |
| 2012/0318336 A1 | 12/2012 | Hekmatshoar-Tabari |
| 2012/0322164 A1 | 12/2012 | Lal |
| 2013/0000704 A1 | 1/2013 | Fogel |
| 2013/0020620 A1 | 1/2013 | Wober |
| 2013/0037100 A1 | 2/2013 | Platzer Bjorkman et al. |
| 2013/0112256 A1 | 5/2013 | Yu |
| 2013/0125965 A1 | 5/2013 | Hazeghi et al. |
| 2013/0174904 A1 | 7/2013 | Yamasaki |
| 2013/0220406 A1 | 8/2013 | Day |
| 2013/0341749 A1 | 12/2013 | Yu et al. |
| 2014/0045209 A1 | 2/2014 | Chou |
| 2014/0117401 A1 | 5/2014 | Herner |

FOREIGN PATENT DOCUMENTS

| | | |
|---|---|---|
| CN | 100350429 | 11/2007 |
| CN | 101459185 | 6/2009 |
| CN | 100568516 | 12/2009 |
| CN | 101675522 | 3/2010 |
| CN | 101681941 | 3/2010 |
| EP | 0809303 B1 | 9/2006 |
| FR | 2923651 | 5/2009 |
| GB | 2348399 A | 4/2000 |
| JP | 359013708 A | 1/1984 |
| JP | 59198413708 | 1/1984 |
| JP | 2000324396 | 11/2000 |
| JP | 2002151715 | 5/2002 |
| JP | 2005252210 | 9/2005 |
| JP | 2005328135 | 11/2005 |
| JP | 2007134562 | 5/2007 |
| JP | 2007152548 | 6/2007 |
| JP | 2007184566 | 7/2007 |
| JP | 2007520877 | 7/2007 |
| JP | 2007201091 | 8/2007 |
| JP | 2007317961 | 12/2007 |
| JP | 2008288585 | 11/2008 |
| JP | 2009506546 | 2/2009 |
| JP | 2009236914 | 10/2009 |
| JP | 2013513253 | 4/2013 |
| JP | 2013513254 | 4/2013 |
| TW | I318418 | 5/2004 |
| TW | I228782 | 3/2005 |
| TW | 200535914 | 11/2005 |
| TW | 200536048 | 11/2005 |
| TW | 200742115 | 4/2007 |
| TW | 200810100 | 2/2008 |
| TW | 200814308 | 3/2008 |
| TW | 200845402 | 11/2008 |
| TW | 200847412 | 12/2008 |
| TW | 200915551 | 4/2009 |
| TW | 200941716 | 10/2009 |
| TW | 201027730 | 7/2010 |
| TW | 201034172 | 9/2010 |
| TW | 201044610 | 12/2010 |
| TW | 201140859 | 11/2011 |
| WO | 8603347 | 6/1986 |
| WO | 0002379 | 1/2000 |
| WO | 03107439 A1 | 12/2003 |
| WO | 2005064337 | 7/2005 |
| WO | 2008069565 | 6/2008 |
| WO | 2008079076 | 7/2008 |
| WO | 2008131313 | 10/2008 |
| WO | 2008135905 | 11/2008 |
| WO | 2008135905 A3 | 11/2008 |
| WO | 2008143727 | 11/2008 |
| WO | 2009099841 | 8/2009 |
| WO | 2009116018 | 9/2009 |
| WO | 2009137241 | 11/2009 |
| WO | 2010019887 | 2/2010 |
| WO | 2010039631 | 4/2010 |
| WO | 2011074457 | 6/2011 |

OTHER PUBLICATIONS

U.S. Office Action for U.S. Appl. No. 13/048,635, mailed Jun. 6, 2013, 24 pages.
U.S. Office Action for U.S. Appl. No. 12/966,535, mailed Jun. 14, 2013, 22 pages.
International Preliminary Search Report on Patentability of PCT/US201-057325, mailed May 2, 2013.
U.S. Office Action for U.S. Appl. No. 13/966,573, dated Aug. 6, 2013, 13 pages.
U.S. Office Action for U.S. Appl. No. 12/966,514, dated Aug. 15, 2013, 17 pages.
U.S. Office Action for U.S. Appl. No. 12/633,313, dated Aug. 1, 2013, 20 pages.
U.S. Office Action for U.S. Appl. No. 13/494,661, notification date Nov. 7, 2012.
U.S. Office Action for U.S. Appl. No. 12/573,582, dated Jun. 28, 2012.
Taiwanese Office Action of Taiwan Patent Application No. 099116881, issued Jul. 18, 2013 (8 pages).
Canadian Office Action of Canadian Application No. 3,676,376, dated Oct. 11, 2013.
Catrysse, et al., An Integrated Color Pixel in 0.18pm CMOS Technology, Proceedings IEDM 2001, pp. 559-562.
Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.
Geyer et al., Model for the Mass Transport during Metal-Assisted Chemical Etching with Contiguous Metal Films as Catalysts, J. Phys. Chem. C 2012, 116, 13446-13451.
Hopkins, Addressing sidewall roughness using dry etching silicon and Si02, Jul. 1, 2004, ElectroIQ, vol. 47, Issue 7.
Mei-Ling Kuo et al. "Realization of a near-perfect antireflection coating for silicon solar energy utilization" (Nov. 1, 2008, vol. 33, No. 21, Optics Letters).
Mukhopadhyay, When PDMS Isn't the Best, American Chemical Society, May 1, 2007.
Seo, et. al., "Multicolored vertical silicon nanowires," Nano Letters, vol. 11 issue 4, pp. 1851-1856, 2010.
U.S. Final Office Action for U.S. Appl. No. 12/966,514, mailed Mar. 19, 2013, 50 pages.
U.S. Final Office Action for U.S. Appl. No. 13/494,661, mailed Mar. 7, 2013, 10 pages.
Office Action issued on Mar. 3, 2014 in Chinese Application No. 200980142671.9.
Office Action issued on Jan. 28, 2014 in Taiwanese Application No. 100146327.
Office Action issued on Mar. 17, 2014 in Korean Application No. 10-2013-7018243.
U.S. Office Action for U.S. Appl. No. 12/910,664, mailed Feb. 26, 2014.
U.S. Office Action for U.S. Appl. No. 12/966,514, mailed Feb. 25, 2014.
U.S. Office Action for U.S. Appl. No. 14/021,672 mailed May 9, 2014.
U.S. Office Action for U.S. Appl. No. 12/945,492 mailed May 13, 2014.

(56) References Cited

OTHER PUBLICATIONS

U.S. Office Action for U.S. Appl. No. 13/106,851 mailed May 29, 2014.
U.S. Office Action for U.S. Appl. No. 12/982,269 mailed Jun. 11, 2014.
Office Action issued on Jun. 19, 2014 in Taiwanese Application No. 099133891.
Office Action issued on Oct. 29, 2014 in Korean Application No. 10-2013-7020107.
U.S. Office Action for U.S. Appl. No. 13/925,429 mailed Nov. 4, 2014.
Corrected Notice of Allowability issued on Oct. 14, 2014 in U.S. Appl. No. 12/966,535.
U.S. Office Action for U.S. Appl. No. 13/543,307 mailed Dec. 24, 2014.
U.S. Office Action for U.S. Appl. No. 14/274,448 mailed Dec. 5, 2014.
International Search Report and Written Opinion for International Application No. PCT/US2014/056558 mailed Dec. 12, 2014.
Office Action issued on Nov. 11, 2014 in Taiwanese Application No. 098129911.
International Search Report and Written Opinion for International Application No. PCT/US2014/050544 mailed Jan. 9, 2015.
Notice of Allowance issued on Dec. 1, 2014 in U.S. Appl. No. 12/910,664.
U.S. Office Action for U.S. Appl. No. 12/966,514 mailed Sep. 23, 2014.
Berstein et al., "Modern Physics", Chapter 14, Section 6, pp. 420-421, 2000, Prentice-Hall, Inc.
University of California San Diego, Class ECE 183 Lab 1, 2013.
U.S. Office Action for U.S. Appl. No. 12/633,313 mailed Aug. 1, 2014.
U.S. Office Action for U.S. Appl. No. 13/693,207 mailed Oct. 9, 2014.
Adler, Nanowire Lawns Make for Sheets of Image Sensors, NewScientist.com, Jul. 28, 2008.
Babinec et al., High-Flux, Low-Power Diamond Nanowire Single-Photon Source Arrays: An Enabling Material for Optical and Quantum Computing and Cryptography, obtained on Jul. 22, 2010 at URL: http://otd.harvard.edu/technologies/tech.php?case=3702.
Baillie et al., 'Zero-space microlenses for CMOS image sensors: optical modeling and lithographic process development', Publication Date May 2004, http://adsabs.harvard.edu/abs/2004SPIE.5377.953B, pp. 1-2.
Baomin Wang and Paul W. Leu, Nanotechology 23 (2012) 194003, 7 pages.
Barclay et al., Chip-Based Microcavities Coupled to NV Centers in Single Crystal Diamond, Applied Physics Letters, Nov. 12, 2009, vol. 95, Issue 19.
Brouri et al., Photon Antibunching in the Flurescence of Individual Colored Centers in Diamond, Optics Letters, Sep. 1, 2000, vol. 25, Issue 17.
Chung, Sung-Wook et al. Silicon Nanovvire Devices. Applied Physics Letters, vol., 76, No. 15 (Apr. 10, 2000), pp. 2068-2070.
CMOS image sensor pixel microlens array optimization using FDTD Solutions, http://www.lumerical_com/ fdtd_microlens/cmos_image_sensor_pixel_microlens.php, pp. 1-2, Jun. 25, 2008.
CMOS image sensor pixel optical efficiency and optical crosstalk optimization using FDTD Solutions www.lumerical.com/fdtd_microlens/cmos_image_sensor_pixel_microlens.php, Mar. 19, 2009.
Deptuch et al., Vertically Integrated Circuits at Fermilab, IEEE Transactions on Nuclear Science, Aug. 2010, vol. 54, Issue 4, pp. 2178-2186.
Ekroll, On the Nature of Simultaneous Color Contrast, Dissertation, University of Kiel, 2005.
Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.
Fang et al., Fabrication of Slantingly-Aligned Silicon Nanowire Arrays for Solar Cell Applications, Nanotechnology, 2008, Vol, 19, No. 25.
Furumiya, et al, 'High-sensitivity and no-crosstalk pixel technology for embedded CMOS image sensor'; IEEE Electron Device Letters, vol. 48, No. 10, Oct. 2001.
Gadelrab et al., The Source-Gated Amorphous Silicon Photo-Transistor, IEEE Transactions on Electron Devices, Oct. 1997, vol. 44, No. 10, pp. 1789-1794.
Gambino et al., 'CMOS Imager with Copper Wiring and Lightpipe,' Electron Devices Meeting, 2006. IEDM '06, International Publication Date: Dec. 11-13, 2006, pp. 1-4.
Garnett et al., Light Trapping in Silicon Nanowire Solar Cells, Nanoletters, Jan. 28, 2010, vol. 10, No. 3, pp. 1082-1087.
Ge et al., Orientation-Controlled Growth of Single-Crystal Silicon-Nanowire Arrays, Advanced Materials, Jan. 18, 2005, vol. 17, No. 1, pp. 56-61.
Guillaumée, et al., Polarization Sensitive Silicon Photodiodes Using Nanostructured Metallic Grids, Applied Physics Letters 94, 2009.
Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.
Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.
Hochbaum et al., Controlled Growth of Si Nanowire Arrays for Device Integration, Nano Letters, Mar. 2005, vol. 5, No. 3, pp. 457-460.
Holmes et al., Control of Thickness and Orientation of Solution-Grown Silicon Nanowires, Science, Feb. 25, 2000, vol. 287, No. 5457, pp. 1471-1473.
International Preliminary Report and Written Opinion re PCT/US 2010-059468, mailed Jun. 21, 2012.
International Preliminary Report and Written Opinion re PCT/US2010/059491, mailed Jun. 21, 2012.
International Preliminary Report and Written Opinion re PCT/US2010/059496, mailed Jun. 21, 2012.
International Preliminary Report and Written Opinion re PCT/US2010/059504, mailed Jun. 21, 2012.
International Preliminary Report on Patentability for PCT International Application No. PCT/US2010/035722, mailed Nov. 3, 2011.
International Preliminary Report on Patentability for PCT International Patent Application No. PCT/US2009/055963, mailed Mar. 17, 2011.
International Search Report and Written Opinion for PCT International Application No. PCT/US2010/035722, mailed Jul. 20, 2010.
International Search Report and Written Opinion for PCT International Application No. PCT/US2010/035726, mailed Jul. 21, 2010.
International Search Report and Written Opinion for PCT International Application No. PCT/US2010/057227, mailed Jan. 26, 2011.
International Search Report and Written Opinion for PCT International Patent Application No. PCT/US2009/055963, mailed Oct. 15, 2009.
International Search Report and Written Opinion for PCT International Patent Application No. PCT/US2009/063592, mailed Jan. 13, 2010.
International Search Report and Written Opinion for PCT International Patent Application No. PCT/US2010/035727, mailed Sep. 27, 2010.
International Search Report and Written Opinion for PCT International Patent Application No. PCT/US2010/051435, mailed Dec. 3, 2010.
International Search Report and Written Opinion for PCT International Patent Application No. PCT/US2010/051446, mailed Jan. 3, 2011.
International Search Report and Written Opinion for PCT International Patent Application No. PCT/US2010/059468, mailed Feb. 11, 2011.

(56) References Cited

OTHER PUBLICATIONS

International Search Report and Written Opinion for PCT International Patent Application No. PCT/US2010/059491, mailed Feb. 9, 2011.
International Search Report and Written Opinion for PCT International Patent Application No. PCT/US2010/059501, mailed Feb. 15, 2011.
International Search Report and Written Opinion for PCT International Patent Application No. PCT/US2010/059504, mailed Apr. 7, 2011.
International Search Report and Written Opinion for PCT International Patent Application No. PCT/US2011/060348, mailed Mar. 9, 2012.
International Search Report and Written Opinion for PCT International Patent Application No. PCT/US2011/064635, mailed Apr. 13, 2012.
International Search Report and Written Opinion for PCT International Patent Application No. PCT/US2011/066097, mailed Mar. 12, 2012.
International Search Report and Written Opinion for PCT International Patent Application No. PCT/US2011/067712, mailed May 3, 2012.
International Search Report and Written Opinion re PCT/US2011/57325, mailed Jun. 22, 2012.
Jin-Kon Kim; 'New Functional Nanomaterials Based on Block Copolymers' http://www.ziu.edu.cn/adver/subjectizyhd/jz0707061313.html, Jul. 7, 2011.
Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.
Junger, et. al., Polarization- and wavelength-sensitive sub-wavelength structures fabricated in the metal layers of deep submicron CMOS processes, Proc. of SPIE, vol. 7712, 2010.
Kane, Why Nanowires Make Great Photodetectors, EurekAlert.com article, Apr. 25, 2007.
Kempa, Thomas J. et al. Single and Tandem Axial p-i-n. Nanowire Photovoltaic Devices. Nano Letters. 2008, vol. 8, No. 10, 3456-3460.
Kim et al., Electronic Structure of Vertically Aligned Mn-Doped CoFe2O4 Nanowires and Their Application as Humidity Sensors and Photodetectors, Journal of Physical Chemistry C, Apr. 7, 2009.
Law, et al., 'Semiconductor Nanowires and Nanotubes'; Annu, Rev. Mater. Res. 2004, 34:83-122.
Lee et al., Vertical Pillar-Superlattice Array and Graphene Hybrid Light Emitting Diodes, Nano Letters, 2010, vol. 10, pp. 2783-2788.
Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.
Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.
Loncar et al., Diamond Nanotechnology, SPIE Newsroom, May 18, 2010, obtained at url: http://spie.org/x40194,xml?ArticleID=x40194.
Loose et al., CMOS Detector Technology, Scientific Detector Workshop, Sicily, 2005, Experimental Astronomy, vol. 19, Issue 1-3, pp. 111-134.
Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., CRC Press, 2002, pp. 125-204.

Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Morales et al., A Laser Ablation Method for the Synthesis of Crystalline Semiconductor Nanowires, Science, Jan. 9, 1998, vol. 279, pp. 208-211.
N. L. Dmitruk, et al.; 'Modeling and Measurement of Optical Response of 1D Array of Metallic Nanowires for Sensing and Detection Application'; 26th International Conference on Microelectronics (MIEL 2008), Nis, Serbia, May 11-14, 2008.
Nguyen et al., Deep Reactive Ion etching of Polyimide for Microfluidic Applications, Journal of the Korean Physical Society, Sep. 2007, vol. 51, No. 3, pp. 984-988.
Ozgur Yavuzcetin, et al.; 'Index-tuned Anti-reflective Coating using a Nanostructured Metamaterial'; http://www.umass.edu/research/rld/bioportal/vuewtech.php?tid=40, Feb. 28, 2007.
Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol. 15, No. 6.
Reynard Corporation; 'Anti-Reflection Coatings (AR)', http://www.reynardcorp.com/coating_anti_reflection.php, undated.
Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.
Rugani, First All-Nanowire Sensor, Technology Review, Aug. 13, 2008, Published by MIT.
Rutter, Diamond-Based Nanowire Devices Advance Quantum Science, SEAS Communications, Feb. 14, 2010, obtained at url:http://news.harvard.edu/gazette/story/2010/02/digging-deep-into-diamonds/.
Sangmoo Jeon, et al., Nano Lett. 2012, 12, 2971-2976.
Sangmoo Jeong et al., J. Vac. Sci. Technol, A 30(6), Nov./Dec. 2012.
Sarkar et. al., Integrated polarization-analyzing CMOS image sensor for detecting incoming light ray direction, Sensors Application Symposium (SAS), Mar. 29, 2012, p. 194-199, 1010 IEEE.
Schmidt et al,, Realization of a Silicon Nanowire Vertical Surround-Gate Field-Effect Transistor, Small, Jan. 2006, vol. 2, No. 1, pp. 85-88.
Shimizu et al., Homoepitaxial Growth of Vertical Si Nanowires on Si(100) Substrate using Anodic Aluminum Oxide Template, (abstract only), Materials Research Society, Fall 2007.
Song et al., Vertically Standing Ge Nanowires on GaAs(110) Substrates, Nanotechnology 19, Feb. 21, 2008.
T. H. Hsu, et al. 'Light Guide for Pixel Crosstalk Improvement in Deep Submicron CMOS Image Sensor'; IEEE Electron Device Letters, vol. 25, No. 1, Jan. 2004.
Thelander et al., Nanowire-Based One-Dimensional Electronics, Materials Today, Oct. 2006, vol. 9, No. 10, pp. 28-35.
Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.
Tseng, et al. 'Crosstalk improvement technology applicable to 0.14 μm CMOS image sensor'; IEEE International Electron Devices Meeting, Dec. 13-15, 2004; IEDM Technical Digest, pp. 997-1000.
Verheijen, Marcel A. et al. Growth Kinetics of Heterostructured GaP-GaAs Nanowires. J. Am. Chem. Soc. 2006, 128, 1353-1359.
Wagner, R.S. and Ellis, W.C. Vapor-Liquid-Solid Mechanism of Single Crystal Growth. Applied Physics Letters. vol. 4, No. 5 (Mar. 1, 1964), pp. 89-90.
Wang, Introduction to Nanotechnology—Where Opportunities arise Great Future Being Built from Small Things, Fall 2008.
William Shockley and H. Queisser, Detailed Balance Limit of Efficiency of p-n Junction Solar Cells, J. of Appl. Physics, Mar. 1961, 32(3).
Wong et al., Lateral Nanoconcentrator Nanowire Multijunction Photovoltaic Cells, GCEP Progress report, Apr. 20, 2009, pp. 1-18.

(56) References Cited

OTHER PUBLICATIONS

Ye et al., Fabrication Techniques of High Aspect Ratio Vertical Lightpipes Using a Dielectric Photo Mask, SPIE, Proceedings, Feb. 2010, vol. 7591.

Zhang et al., Ultrahigh Responsivity Visible and Infrared Detection Using Silicon Nanowire Phototransistors, Nanoletters, May 14, 2010, vol. 10, No. 6, pp. 2117-2120.

Office Action issued Jul. 9, 2015 in Taiwanese Application No. 102124069.

A. Gu et al., "Design and growth of III-V nanowire solar cell arrays on low cost substrates," Conf. Record, 35rd IEEE Photovoltaic Specialists Conference, Honolulu, Jun. 2010, pp. 20-25.

Office Action issued Jun. 23, 2015 in Chinese Application No. 201310284409.6.

Notice of Allowance issued Jan. 30, 2015 in U.S. Appl. No. 14/487,375.

Office Action for U.S. Appl. No. 12/982,269, mailed Jan. 15, 2015.
Office Action for U.S. Appl. No. 12/945,492 mailed Jan. 16, 2015.
Office Action for U.S. Appl. No. 12/966,514 mailed Mar. 10, 2015.
Office Action for U.S. Appl. No. 13/963,847 mailed Mar. 12, 2015.
Office Action issued on Jan. 16, 2015 in Chinese Application No. 201180054442.9.
Office Action issued Feb. 23, 2015 in U.S. Appl. No. 13/925,429.
Bernstein et al., "Modern Physics", Chapter 14, Section 6, pp. 420-421, 2000 by Prentice Hall, Inc.
Kosonocky, et al., 160 x 244 Element PtSi Schottky-Barrier IR-CCD Image Sensor, IEEE Transactions on Electron Devices, vol. Ed-32, No. 8, Aug. 1985.
Office Action issued Apr. 3, 2015 in Chinese Application No. 201180051048.X.
Office Action issued May 22, 2015 in Taiwanese Application No. 099142971.
Office Action mailed May 26, 2015 in Japanese Application No. 2014 138265.
Office Action for U.S. Appl. No. 14/068,864 mailed Jun. 15, 2015.
Office Action issued on May 5, 2015 in Chinese Application No. 201410264248.9.
Office Action for U.S. Appl. No. 13/693,207 mailed May 7, 2015.
Kim, Y.S. et al., "ITO/AU/ITO multilayer thin films for transparent conducting electrode applications", Applied Surface Science, vol. 254 (2007), pp. 1524-1527.
Philipp, H.R. et al., "Optical Constants of Silicon in the Region 1 to 10 ev", Physical Review, vol. 120, No. 1, pp. 37-38.
Office Action for U.S. Appl. No. 13/543,307 mailed Apr. 17, 2015.
Office Action issued Mar. 19, 2015 in Chinese Application No. 201180065814.8.
Office Action for U.S. Appl. No. 13/288,131 mailed Apr. 17, 2015.
Office Action for U.S. Appl. No. 14/281,108 mailed Apr. 6, 2015.
Office Action for U.S. Appl. No. 14/450,812 mailed Apr. 1, 2015.
Office Action for U.S. Appl. No. 12/633,313 mailed Apr. 9, 2015.
Office Action issued on Mar. 18, 2015 in Chinese Application No. 201180066970.6.
Office Action issued May 15, 2015 in U.S. Appl. No. 14/274,448.
Office Action for U.S. Appl. No. 12/982,269 mailed May 22, 2015.
Office Action for U.S. Appl. No. 14/450,812 mailed Jul. 23, 2015.
Office Action for U.S. Appl. No. 14/293,164 mailed Aug. 14, 2015.
Office Action issued on Mar. 4, 2015 in U.S. Appl. No. 13/556,041.
Bernstein et al. "Modern Physics", Chapter 14, Section 6, pp. 420-421, 2000 by Prentice-Hall Inc.
Office Action issued Aug. 12, 2015 in Chinese Application No. 201180054442.9.
Office Action mailed Sep. 30, 2015 in Japanese Application No. 2014-094365.
Office Action for U.S. Appl. No. 12/966,514 mailed Nov. 2, 2015.
Office Action for U.S. Appl. No. 12/633,313 mailed Oct. 21, 2015.
Office Action for U.S. Appl. No. 13/963,847 mailed Sep. 1, 2015.
Office Action for U.S. Appl. No. 12/945,492 mailed Sep. 9, 2015.
Office Action for U.S. Appl. No. 14/459,398 mailed Sep. 16, 2015.
Office Action for U.S. Appl. No. 14/274,448 mailed Aug. 26, 2015.
Office Action for U.S. Appl. No. 13/288,131 mailed Oct. 22, 2015.
Office Action for U.S. Appl. No. 12/945,429 mailed Sep. 4, 2015.
Office Action for U.S. Appl. No. 14/450,812 mailed Oct. 28, 2015.
Office Action dated Oct. 6, 2015 in Taiwanese Application No. 100141376.
Office Action dated Sep. 11, 2015 in Taiwanese Application No. 103143553.
International Search Report and Written Opinion mailed Nov. 27, 2015 in International Application No. PCT/US2015/038999.
Office Action issued on Nov. 25, 2015 in Japanese Application No. 2015-005091.
Office Action issued Oct. 22, 2015 in Taiwanese Application No. 103139449.
Office Action issued Oct. 16, 2015 in Taiwanese Application No. 103145582.
Office Action issued Nov. 17, 2015 in Taiwanese Application 103102171.

* cited by examiner

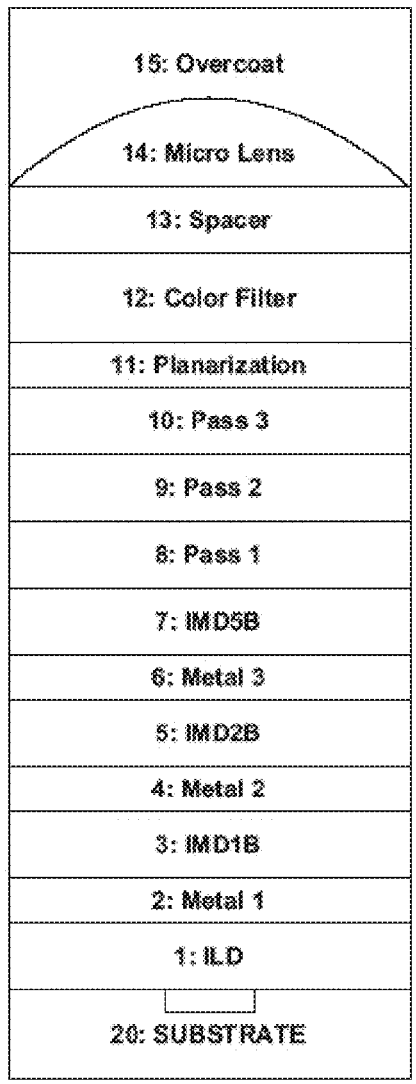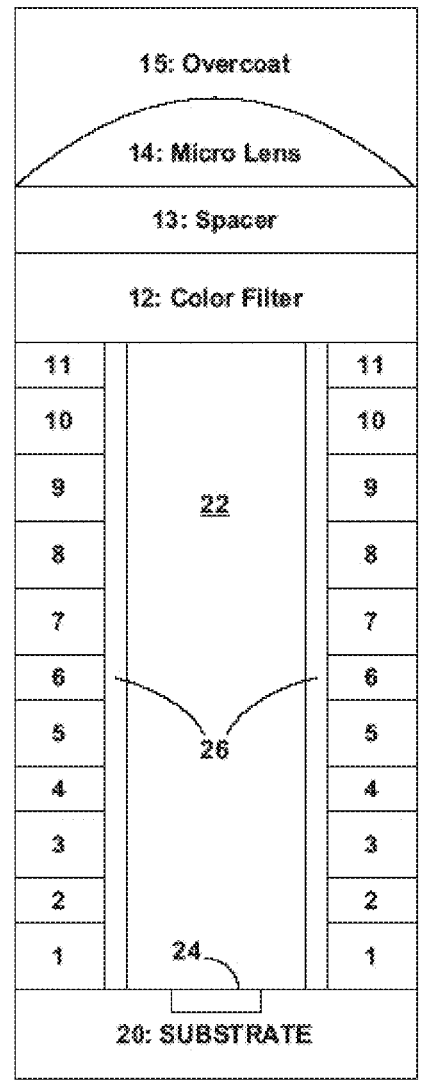
FIG. 1
FIG. 2

(C) Microlenses are formed from the polymeric layer

OPTICAL WAVEGUIDES IN IMAGE SENSORS

CROSS REFERENCE TO RELATED APPLICATIONS

This Application is a continuation of U.S. patent application Ser. No. 12/648,942, filed Dec. 29, 2009, which is a continuation-in-part of and claims the benefit of the earlier filing date of co-pending U.S. patent application Ser. No. 12/204,686, filed Sep. 4, 2008, the entire contents of which are incorporated herein by reference.

FIELD OF INVENTION

The embodiments relate to an integrated circuit manufacture, more particularly, to manufacturing more efficient CMOS image sensors.

BACKGROUND

An image sensor has a large number of identical sensor elements (pixels), generally greater than 1 million, in a Cartesian (square) grid. The distance between adjacent pixels is called the pitch (p). The area of a pixel is $p^2$. The area of the photosensitive element, i.e., the area of the pixel that is sensitive to light for conversion to an electrical signal, is normally only about 20% to 30% of the surface area of the pixel.

The challenge of a designer is to channel as much of the light impinging on the pixel to the photosensitive element of the pixel. There are a number of factors that diminish the amount of light from reaching the photosensitive element. One factor is the manner in which the image sensor is constructed. A complementary metal oxide semiconductor (CMOS) image sensor is manufactured by a process of etching and depositing a number of layers of oxides of silicon, metal and nitride on top of crystalline silicon. The layers of a typical sensor are listed in Table I and shown in FIG. 1.

TABLE I

| | Typical Layer Description | Thickness (μm) |
|---|---|---|
| 15 | OVERCOAT | 2.00 |
| 14 | MICRO LENS | 0.773 |
| 13 | SPACER | 1.40 |
| 12 | COLOR FILTER | 1.20 |
| 11 | PLANARIZATION | 1.40 |
| 10 | PASS3 | 0.600 |
| 9 | PASS2 | 0.150 |
| 8 | PASS1 | 1.00 |
| 7 | IMD5B | 0.350 |
| 6 | METAL3 | 31.18 |
| 5 | IMD2B | 0.200 |
| 4 | METAL2 | 21.18 |
| 3 | IMD1B | 0.200 |
| 2 | METAL1 | 1.18 |
| 1 | ILD | 0.750 |

In Table I, typically the first layer on a silicon substrate is the ILD layer and the topmost layer is the overcoat. In Table I, ILD refers to a inter-level dielectric layer, METAL1, METAL2 and METAL3 refer to different metal layers, IMD1B, IMD2B and IMD5B refer to different inter-metal dielectric layers which are spacer layers, PASS1, PASS2 and PASS3 refer to different passivation layers (typically dielectric layers).

The total thickness of the layers above the silicon substrate of the image sensor is the stack height (s) of the image sensor and is the sum of the thickness of the individual layers. In the example of Table I, the sum of the thickness of the individual layers is about 11.6 micrometers (μm).

The space above the photosensitive element of a pixel must be transparent to light to allow incident light from a full color scene to impinge on the photosensitive element located in the silicon substrate. Consequently, no metal layers are routed across the photosensitive element of a pixel, leaving the layers directly above the photosensitive element clear.

The pixel pitch to stack height ratio (p/s) determines the cone of light (F number) that can be accepted by the pixel and conveyed to the photosensitive element on the silicon. As pixels become smaller and the stack height increases, this number decreases, thereby lowering the efficiency of the pixel.

More importantly, the increased stack height with greater number of metal layers obscure the light from being transmitted through the stack to reach the photosensitive element, in particular of the rays that impinge the sensor element at an angle. One solution is to decrease the stack height by a significant amount (i.e., >2 μm). However, this solution is difficult to achieve in a standard CMOS process.

Another issue, which possibly is the one that most limits the performance of the conventional image sensors, is that less than about one-third of the light impinging on the image sensor is transmitted to the photosensitive element such as a photodiode. In the conventional image sensors, in order to distinguish the three components of light so that the colors from a full color scene can be reproduced, two of the components of light are filtered out for each pixel using a filter. For example, the red pixel has a filter that absorbs green and blue light, only allowing red light to pass to the sensor.

DESCRIPTION OF THE FIGURES

FIG. 1 shows a cross sectional view of a conventional image sensor.

FIG. 2 shows a cross sectional view of an embodiment of an image sensor.

DETAILED DESCRIPTION

Figure 3:
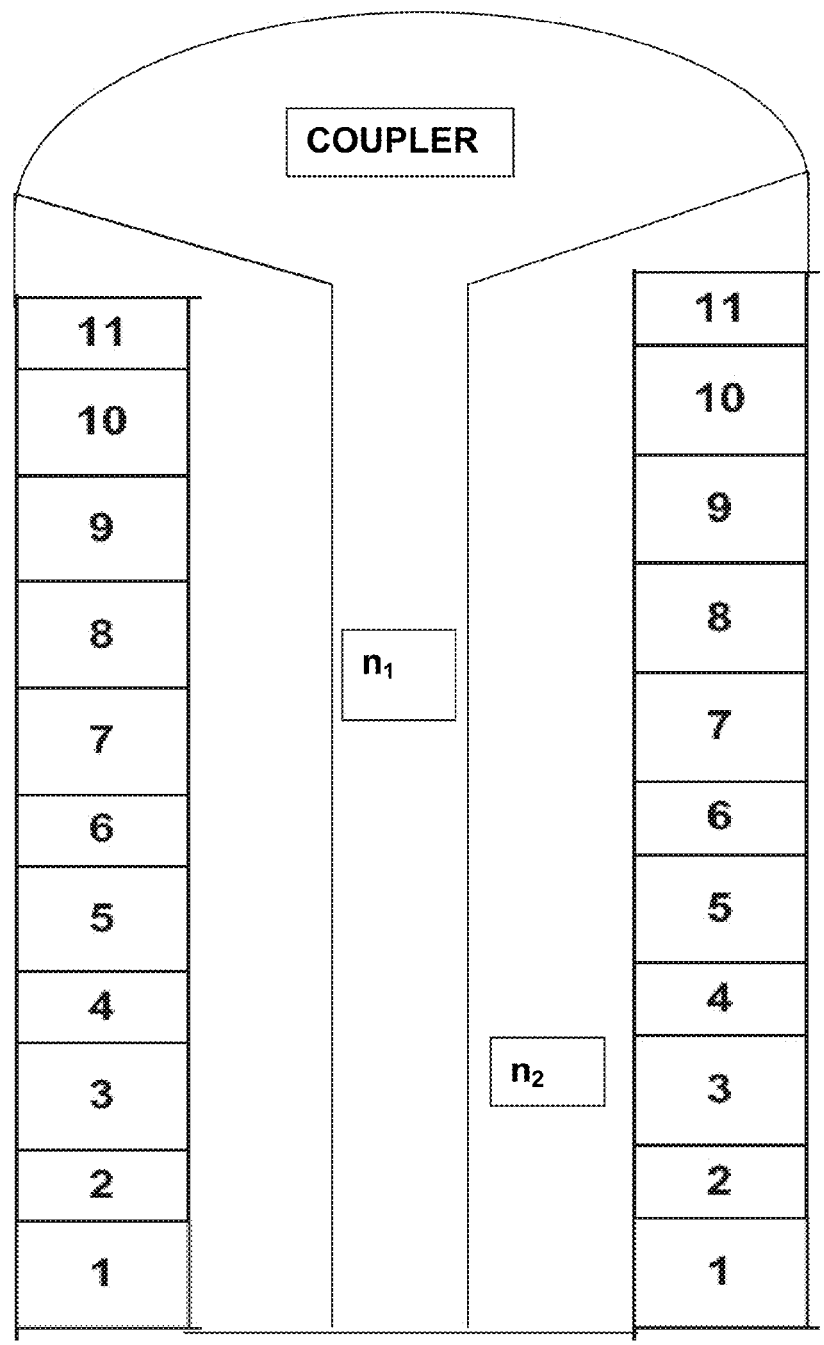
FIG. 3 shows a cross sectional view of another embodiment of an image sensor having a microlens.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

This disclosure is drawn, inter alia, to methods, apparatus, systems, and devices related to an image sensor and compound pixels. An embodiment relates to a method for increasing the efficiency of an image sensor. Another embodiment provides a means for eliminating the color filter so that more than only one-third of the impinging light is use to produce an electrical signal. Another embodiment relates to a method for increasing the efficiency of an image sensor by increasing the amount of electromagnetic radiation such as light impinging on the image sensor. An embodiment of the image sensor comprises an optical pipe such as a light pipe to transfer electromagnetic radiation incident on the image sensor to the photosensitive element on or within the substrate of the image sensor. The optical pipe include of a high refraction index core with a lower refraction index cladding. The end of the optical pipe adjacent to the photosensitive element is about the same size as the photosensitive element so that most or all of the electromagnetic radiation in the pipe impinges on the photosensitive element. A coupler that may take the shape of a micro lens efficiently could be located on the optical pipe to collect and guide the electromagnetic radiation into the optical pipe.

Another embodiment relates to use the optical pipe to eliminate pigmented color filters that absorb about ⅔ of the light that impinges on the image sensor. The core and the cladding of the optical pipe could function as waveguides. Waveguides do not absorb light like color filters, but can be designed to selectively transmit selected wavelengths.

A waveguide has a cutoff wavelength that is the lowest frequency that the waveguide can propagate. As a result, a waveguide in the core whose cutoff wavelength is at green will not propagate red light, and a waveguide in the core whose cutoff wavelength is at blue will not propagate red and green light. In one implementation, a blue waveguide and a blue/green waveguide could be embedded within a white waveguide, which could be in the cladding. For example, any blue light could remain in the blue waveguide in a core, any blue or green light could remain in the green/blue waveguide of another core, and the remainder of the light could remain in the white waveguide in one or more the claddings.

An embodiment relates to an image sensor comprising (a) a optical pipe comprising a core and a cladding, and (b) a pair of photosensitive elements comprising a central photosensitive element and a peripheral photosensitive element, wherein the central photosensitive element is operably coupled to the core and the peripheral photosensitive element is operably coupled to the cladding. Preferably, the image sensor comprises no color filter, or optionally it could comprise a color filter. Preferably, the optical pipe is circular, non-circular or conical. Preferably, the core has a core index of refraction ($n_1$) and the cladding has a cladding index of refraction ($n_2$), and further wherein $n_1$ is greater than $n_2$. Preferably, the optical pipe is configured to separate wavelengths of an electromagnetic radiation beam incident on the image sensor at a cutoff wavelength through the core and the cladding. Preferably, the optical pipe is configured to separate wavelengths of an electromagnetic radiation beam incident on the image sensor at a cutoff wavelength through the core and the cladding without a color filter. Preferably, an electromagnetic radiation beam receiving end of the optical pipe comprises a curved surface. Preferably, the core has a greater cross-sectional area at an electromagnetic radiation beam receiving end of the core than that at an electromagnetic radiation beam emitting end of the core. Preferably, the pair of photosensitive elements are located on or within a substrate.

The image sensor could further comprise a lens structure or an optical coupler over the optical pipe, wherein the lens structure or the optical coupler is operably coupled to the optical pipe. Preferably, the core comprises a first waveguide having a cutoff wavelength such that electromagnetic radiation of wavelength greater than the cutoff wavelength leaks out from the core into the cladding. Preferably, the cladding comprises a second waveguide that permits electromagnetic radiation of wavelength of greater than the cutoff wavelength to remains within the cladding and be transmitted to the peripheral photosensitive element. Preferably, a cross-sectional area of the core at an electromagnetic radiation beam emitting end of the core is substantially equal to an area of the central photosensitive element. Preferably, a cross-sectional area of the cladding at an electromagnetic radiation beam emitting end of the cladding is substantially equal to an area of the peripheral photosensitive element.

The image sensor could further comprise a stack surrounding the optical pipe, the stack comprising metallic layers embedded in dielectric layers, wherein the dielectric layers have a lower refractive index than that of the cladding. Preferably, a surface of the stack comprises a reflective surface. Preferably, the image sensor is a complementary metal oxide semiconductor (CMOS) image sensor. Preferably, the optical is could also be used for charge-coupled devices (CCD). Preferably, an amount of an electromagnetic radiation beam impinging on the image sensor is transmitted to the photosensitive element is greater than about a third of the electromagnetic radiation beam impinging on the image sensor. Preferably, the core has a core index of refraction ($n_1$), the cladding has a cladding index of refraction ($n_2$), and the stack has a stack refractive index ($n_3$), and further wherein $n_1 > n_2 > n_3$. Preferably, the photosensitive element comprises a photodiode. Preferably, the core is the first waveguide and the cladding is the second waveguide. Preferably, the lens structure or the optical coupler comprises a curved surface and a flat surface such that the lens structure or the optical coupler is shaped as a stationary liquid droplet. Preferably, the lens structure or the optical coupler comprises a first opening and a second opening with the first opening being larger than the second opening, and a connecting surface extending between the first and second openings. Preferably, a diameter of the first opening is substantially the same as a diameter of the cladding and a diameter of the second opening is substantially the same as a diameter of the core. Preferably, the connecting surface is flat or curved. Preferably, the connecting surface comprises a reflective surface.

Another embodiment relates to a compound pixel comprising at least two different image sensors, each image sensor comprising (a) a optical pipe comprising a core and a cladding, and (b) a pair of photosensitive elements comprising a central photosensitive element and a peripheral photosensitive element, wherein the central photosensitive element is operably coupled to the core and the peripheral photosensitive element is operably coupled to the cladding, wherein each of the at least two different image sensors is configured to separate wavelengths of an electromagnetic radiation beam incident on the compound pixel at a cutoff wavelength, and the compound pixel is configured to reconstruct a spectrum of wavelengths of the electromagnetic radiation beam. Preferably, the core comprises a first waveguide having the cutoff wavelength such that electromagnetic radiation of wavelength greater than the cutoff wavelength leaks out from the core into the cladding, further wherein the cutoff wavelength of the core of each of the at least two different image sensors is different such that the at least two different image sensors separate the electromagnetic radiation beam incident on the compound pixel at different cutoff wavelengths. Preferably, the cladding comprises a second waveguide that permits electromagnetic radiation of wavelength of greater than the cutoff wavelength to remains within the cladding and be transmitted to the peripheral photosensitive element. Preferably, a cross-sectional area of the cladding at an electromagnetic radiation beam emitting end of the cladding is substantially equal to an area of the peripheral photosensitive element. The compound pixel could further comprise a stack of metallic and non-metallic layers surrounding the optical pipe of each of the at least two different optical sensors.

Another embodiment relates to a compound pixel comprising at least a first image sensor and a second image sensor, wherein the first image sensor is configured to provide a first separation of an electromagnetic radiation beam incident on the image sensor at a first cutoff wavelength without any color filter, the second image sensor is configured to provide a second separation of the electromagnetic radiation beam incident on the image sensor at a second cutoff wavelength without any color filter, the first cutoff wavelength is different from the second cutoff wavelength, and the compound pixel is configured to reconstruct a spectrum of wavelengths of the electromagnetic radiation beam. Preferably, the first image sensor comprises a first waveguide having the first cutoff wavelength such that electromagnetic radiation of wavelength greater than the first cutoff wavelength leaks out from the first waveguide, wherein the second image sensor comprises a second waveguide having the second cutoff wavelength such that electromagnetic radiation of wavelength greater than the second cutoff wavelength leaks out from the second, further wherein the first cutoff wavelength is different from the second cutoff wavelength. Preferably, the first image sensor further comprises a first white waveguide that permits electromagnetic radiation of wavelength of greater than the first cutoff wavelength to remains within the first white waveguide and the second image sensor further comprises a second white waveguide that permits electromagnetic radiation of wavelength of greater than the second cutoff wavelength to remains within the second white waveguide. Preferably, the first image sensor comprises a first pair of photosensitive elements and the second image sensor comprises a second pair of photosensitive elements. The compound pixel could further comprise a stack of metallic and non-metallic layers in the vicinity of the first and second waveguides. Preferably, the two different image sensors comprise cores of different diameters. Preferably, the first image sensor comprises a core of a different diameter than that of the second image sensor.

Another embodiment relates to a method of manufacturing an image sensor, comprising (a) forming a pair of photosensitive elements comprising a central photosensitive element and a peripheral photosensitive element, and (b) forming a optical pipe comprising a core and a cladding, wherein the central photosensitive element is operably coupled to the core and the peripheral photosensitive element is operably coupled to the cladding.

The embodiments relate to a high efficiency image sensor and a method for increasing the efficiency of an image sensor. The efficiency could be increased when more of the light impinging on an image sensor is received by the photosensitive element and converted to an electrical signal.

The method of manufacturing an embodiment of the image sensor (FIG. 2) comprises the formation of an optical pipe using the principles of an optical fiber waveguide. As shown in FIG. 2, an optical pipe comprises a high refraction index core channel (22) that extends from the end of the image sensor receiving incident electromagnetic radiation beam, e.g., overcoat (15), down to the photosensitive element (24) on or within the substrate (20) with a cladding layer (26) of lower refraction index material surrounding the core. In the image sensor of the embodiments disclosed herein, the color filter (12) in FIG. 2 would be optional, and preferably not be included.

Each of the photosensitive elements (photosensors) typically comprises a photodiode, although not limited to only a photodiode. Typically, the photodiode is doped to a concentration from about 1e(E)16 to about 1e(E)18 dopant atoms per cubic centimeter, while using an appropriate dopant.

The layers 1-11 in FIG. 2 illustrate different stacking layers similar to layers 1-11 of FIG. 1. The stacking layers comprise dielectric material-containing and metal-containing layers. The dielectric materials include as but not limited to oxides, nitrides and oxynitrides of silicon having a dielectric constant from about 4 to about 20, measured in vacuum. Also included, and also not limiting, are generally higher dielectric constant gate dielectric materials having a dielectric constant from about 20 to at least about 100. These higher dielectric constant dielectric materials may include, but are not limited to hafnium oxides, hafnium silicates, titanium oxides, barium-strontium titanates (BSTs) and lead-zirconate titanates (PZTs).

The dielectric material-containing layers may be formed using methods appropriate to their materials of composition. Non-limiting examples of methods include thermal or plasma oxidation or nitridation methods, chemical vapor deposition methods (including atomic layer chemical vapor deposition methods) and physical vapor deposition methods.

The metal-containing layers could function as electrodes. Non-limiting examples include certain metals, metal alloys, metal silicides and metal nitrides, as well as doped polysilicon materials (i.e., having a dopant concentration from about 1e18 to about 1e22 dopant atoms per cubic centimeter) and polycide (i.e., doped polysilicon/metal silicide stack) materials. The metal-containing layers may be deposited using any of several methods. Non-limiting examples include chemical vapor deposition methods (also including atomic layer chemical vapor deposition methods) and physical vapor deposition methods. The metal-containing layers could comprise a doped polysilicon material (having a thickness typically in the range 1000 to 1500 Angstrom) from about 1000 to about 1500 angstroms.

The dielectric and metallization stack layer comprises a series of dielectric passivation layers. Also embedded within the stack layer are interconnected metallization layers. Components for the pair of interconnected metallization layers include, but are not limited to contact studs, interconnection layers, interconnection studs.

The individual metallization interconnection studs and metallization interconnection layers that could be used within the interconnected metallization layers may comprise any of several metallization materials that are conventional in the semiconductor fabrication art. Non-limiting examples include certain metals, metal alloys, metal nitrides and metal silicides. Most common are aluminum metallization materials and copper metallization materials, either of which often includes a barrier metallization material, as discussed in greater detail below. Types of metallization materials may differ as a function of size and location within a semiconductor structure. Smaller and lower-lying metallization features typically comprise copper containing conductor materials. Larger and upper-lying metallization features typically comprise aluminum containing conductor materials.

The series of dielectric passivation layers may also comprise any of several dielectric materials that are conventional in the semiconductor fabrication art. Included are generally higher dielectric constant dielectric materials having a dielectric constant from 4 to about 20. Non-limiting examples that are included within this group are oxides, nitrides and oxynitrides of silicon. For example, the series of dielectric layers may also comprise generally lower dielectric constant dielectric materials having a dielectric constant from about 2 to about 4. Included but not limiting within this group are hydrogels, aerogels, silsesquioxane spin-on-glass dielectric materials, fluorinated glass materials and organic polymer materials.

Typically, the dielectric and metallization stack layer comprises interconnected metallization layers and discrete metallization layers comprising at least one of copper metallization materials and aluminum metallization materials. The dielectric and metallization stack layer also comprises dielectric passivation layers that also comprise at least one of the generally lower dielectric constant dielectric materials disclosed above. The dielectric and metallization stack layer could have an overall thickness from about 1 to about 4 microns. It may comprise from about 2 to about 4 discrete horizontal dielectric and metallization component layers within a stack.

The layers of the stack layer could be patterned to form patterned dielectric and metallization stack layer using methods and materials that are conventional in the semiconductor fabrication art, and appropriate to the materials from which are formed the series of dielectric passivation layers. The dielectric and metallization stack layer may not be patterned at a location that includes a metallization feature located completely therein. The dielectric and metallization stack layer may be patterned using wet chemical etch methods, dry plasma etch methods or aggregate methods thereof. Dry plasma etch methods as well as e-beam etching if the dimension needs to be very small, are generally preferred insofar as they provide enhanced sidewall profile control when forming the series of patterned dielectric and metallization stack layer.

The planarizing layer 11 may comprise any of several optically transparent planarizing materials. Non-limiting examples include spin-on-glass planarizing materials and organic polymer planarizing materials. The planarizing layer 11 could extend above the optical pipe such that the planarizing layer 11 would have a thickness sufficient to at least planarize the opening of the optical pipe 22, thus providing a planar surface for fabrication of additional structures within the CMOS image sensor whose schematic cross-sectional diagram is illustrated in FIG. 2. The planarizing layer could be patterned to form the patterned planarizing layer.

Optionally, as shown in FIG. 2, there could be a series of color filter layers 12 located upon the patterned planarizing layer 11. The color filter layers are registered with respect to the photosensor regions 24. Color filter layer 12 while present is not registered with respect to any photosensor region. The series of color filter layers, if present, would typically include either the primary colors of red, green and blue, or the complementary colors of yellow, cyan and magenta. The series of color filter layers would typically comprise a series of dyed or pigmented patterned photoresist layers that are intrinsically imaged to form the series of color filter layers. Alternatively, the series of color filter layers may comprise dyed or pigmented organic polymer materials that are otherwise optically transparent, but extrinsically imaged while using an appropriate mask layer. Alternative color filter materials may also be used. The filter could also be filter for a black and white or IR sensors, wherein the filter cuts off visible and pass IR predominantly.

The spacer layer (13) could be one or more layers made of any material that physically, but not optically, separates the stacking layers from the micro lens (14). The spacer layer could be formed of a dielectric spacer material or a laminate of dielectric spacer materials, although spacer layers formed of conductor materials are also known. Oxides, nitrides and oxynitrides of silicon are commonly used as dielectric spacer materials. Oxides, nitrides and oxynitrides of other elements are not excluded. The dielectric spacer materials may be deposited using methods analogous, equivalent or identical to the methods described above. The spacer layer could be formed using a blanket layer deposition and etchback method that provides the spacer layer with the characteristic inward pointed shape.

The micro lens (14) may comprise any of several optically transparent lens materials that are known in the art. The lens layers may comprise any of several optically transparent lens materials that are known in the art. Non-limiting examples include optically transparent inorganic materials, optically transparent organic materials and optically transparent composite materials. Most common are optically transparent organic materials. Typically the lens layers could be formed incident to patterning and reflow of an organic polymer material that has a glass transition temperature lower than the series of color filter layers 12, if present, or the patterned planarizing layer 11.

In the optical pipe 22, the high index material could, for example, be silicon nitride having a refractive index of about 2.0. The lower index cladding layer material could, for example, be a glass, for example a material selected from Table II, having a refractive index about 1.5.

TABLE II

| Typical Material Index of Refraction | |
|---|---|
| Micro Lens (Polymer) | 1.583 |
| Spacer | 1.512 |
| Color Filter | 1.541 |
| Planarization | 1.512 |
| PESiN | 2.00 |
| PESiO | 1.46 |
| SiO | 1.46 |

In Table II, PESiN refers to plasma enhanced SiN and PESiO refers to plasma enhanced SiO.

Preferably, the cross sectional area of the end of the optical pipe adjacent to the photosensitive element is about the same size as the area of the photosensitive element. Otherwise, electromagnetic radiation guided through the optical pipe outside of the photosensitive element could impinge on non-sensitive regions of the substrate, thereby reducing the amount of light converted to an electrical signal and reducing the efficiency of the image sensor.

Optionally, a micro lens could be located on the optical pipe near the incident electromagnetic radiation beam receiving end of the image sensor. The function of the micro lens or in more general terms is to be a coupler, i.e., to couple the incident electromagnetic radiation beam into the optical pipe. If one were to choose a micro lens as the coupler, its distance from the optical pipe would be much shorter than to the photosensitive element, so the constraints on its curvature are much less stringent, thereby making it implementable with existing fabrication technology.

The shape of the optical pipe could be different for different embodiments. In one configuration, the optical pipe could cylindrical, that is, the diameter of the pipe remains the substantially the same throughout the length of the optical pipe. In another configuration, the optical pipe could conical, where the upper diameter of the cross sectional area of the optical pipe could be greater than the lower diameter of the cross sectional area of the optical pipe. The terms "upper" and "lower" refer to the ends of the optical pipe located closer to the incident electromagnetic radiation beam receiving and exiting ends of the image sensor. Other shapes include a stack of conical sections.

Table II lists several different glasses and their refractive indices. These glasses could be used for the manufacture of the optical pipe such that refractive index of the core is higher than that of the cladding. The CMOS image sensors of the embodiments could be fabricated using different transparent glasses having different refractive indices without the use of pigmented color filters. As waveguides of the embodiments do not absorb light like color filters, but may be designed to selectively transmit selected wavelengths, the light transmission efficiency of the optical pipe could be at least 50%, more preferably at least 75%, most preferably at least 99%, i.e., substantially 100%. With the proper arrangement of waveguides in the optical pipe of the embodiments, it is possible to more efficiently transmit the electromagnetic radiation beam incident on the image sensor to the photosensitive element, thereby increasing the sensitivity of the sensor.

In some embodiments, the optical pipe could be circular in or cross section so as to function as a circular waveguide characterized by the following parameters: (1) the core radius (Rc); (2) the core index of refraction ($n_1$); and (3) the cladding index of refraction ($n_2$). These parameters could generally determine the wavelength of light that can propagate through the waveguide. A waveguide has a cutoff wavelength, $\lambda ct$. The portion of the incident electromagnetic radiation having wavelengths longer than the cutoff wavelength would not be confined with the core. As a result, an optical pipe that functions as a waveguide whose cutoff wavelength is at green will not propagate red light though the core, and an optical pipe that functions as a waveguide whose cutoff wavelength is at blue will not propagate red and green light through the core.

By nesting optical pipes that function as waveguides and using a micro lens coupler as shown in FIG. 3, an array of image sensors could be configured to obtain complementary colors having wavelengths of electromagnetic radiation separated at a cutoff wavelength in the core and cladding of each optical pipe of every image sensor. The complementary colors are generally two colors when mixed in the proper proportion produce a neutral color (grey, white, or black). This configuration also enables the capture and guiding of most of the electromagnetic radiation incident beam impinging on the micro lens to the photosensitive elements (i.e., photodiodes) located at the lower end of the optical pipe. Two adjacent or substantially adjacent image sensors with different color complementary separation can provide complete information to reconstruct a full color scene according to embodiments described herein. This technology of embodiments disclosed herein can further supplant pigment based color reconstruction for image sensing which suffers from the inefficiency of discarding (through absorption) the non selected color for each pixel.

Each physical pixel of a device containing an image sensor of the embodiments disclosed herein would have two outputs representing the complementary colors, e.g., (cyan, red) designated as output type 1 or (yellow, blue) designated as output type 2. These outputs would be arranged as follows:

```
1 2 1 2 1 2 1 2 1 2 1 2 1 2 1 2...
2 1 2 1 2 1 2 1 2 1 2 1 2 1 2 1...
1 2 1 2 1 2 1 2 1 2 1 2 1 2 1 2...
. . . . . . . . . . . . . . . . . . . . . . . .
. . . . . . . . . . . . . . . . . . . . . . . .
```

Each physical pixel would have complete luminance information obtained by combining its two complementary outputs. As a result, the same image sensor can be used either as a full resolution black and white or full color sensor.

In the embodiments of the image sensors disclosed herein, the full spectrum of wavelengths of the incident electromagnetic radiation beam (e.g., the full color information of the incident light) could be obtained by the appropriate combination of two adjacent pixels either horizontally or vertically as opposed to 4 pixels for the conventional Bayer pattern.

The image sensors of the embodiments disclosed herein would have a three-fold impact on the future of CMOS image sensor technology.

The first impact would be the increase in the F-number, or the light acceptance cone of each pixel, thereby increasing the overall efficiency of the sensor. Also, with the embodiments disclosed herein, the F-number of the sensor would be relatively insensitive to stack height (distance of the surface of the micro lens to the photodiode). Thus, stack eights of 10 microns or greater could be easily accommodated.

The second impact would be the elimination of color filters (unless desired for some other purposes) whose light absorption characteristics reduce the sensitivity of the conventional image sensor by about a factor of three.

The third impact would stem from the fact that advanced CMOS fabrication processes use metals and materials that may compromise the transparency of the electromagnetic radiation beam such as light propagating through all the metal layers stacked on top of the photoelectric element such as a photodiode. An optical pipe of the embodiments disclosed herein would provide a solution to this problem. Also, the system of the embodiments disclosed herein would decouple the light path of the image sensor, i.e., the optical pipe, from impurities that may be introduced during fabrication of patterned stacked layers of the image sensor. The optical pipe itself, however, should be fabricated with low transmission loss materials such as glasses.

Depending on minimum transistor sizes, each pixel containing an image sensor of the embodiments disclosed herein could be as small as 1 micron or less in pitch and yet have sufficient sensitivity. This could open the way for contact imaging of very small structures such as biological systems.

The embodiments, which include a plurality of embodiments of an image sensor, preferably a CMOS image sensor, as well as methods for fabrication thereof, will be described in further detail within the context of the following description. The description is further understood within the context of the drawings described above. The drawings are for illustrative purposes and as such are not necessarily drawn to scale.

Figure 4:
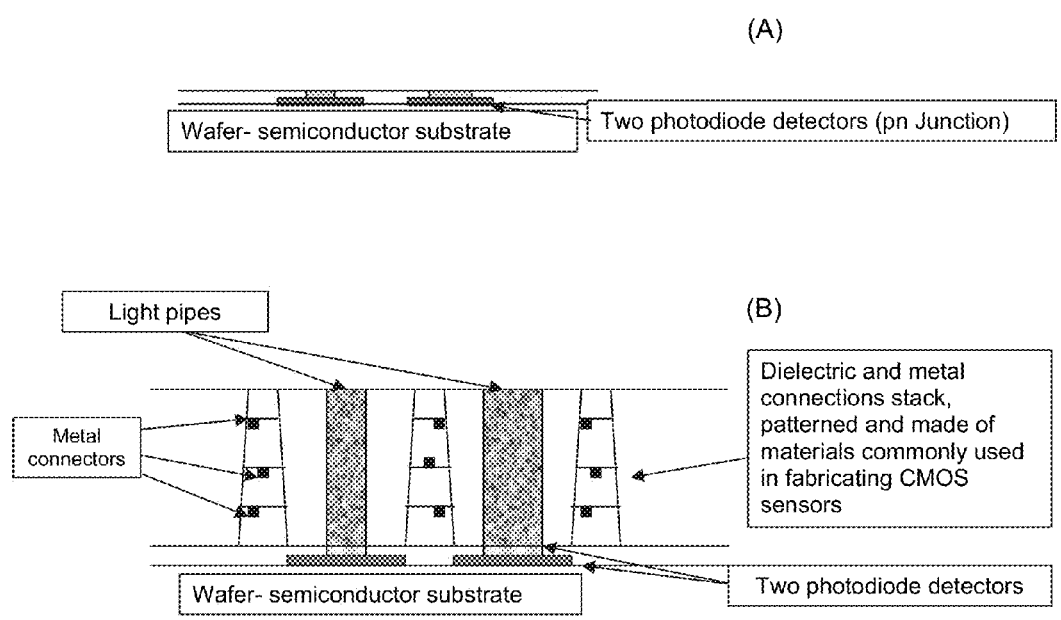
FIG. 4 shows a schematic cross section of a compound pixel having two image sensors having for two apertures ($d_1$ and $d_2$) with light pipes for directing light of different wavelengths ($\lambda_B$ and $\lambda_R$).
Figure 5:
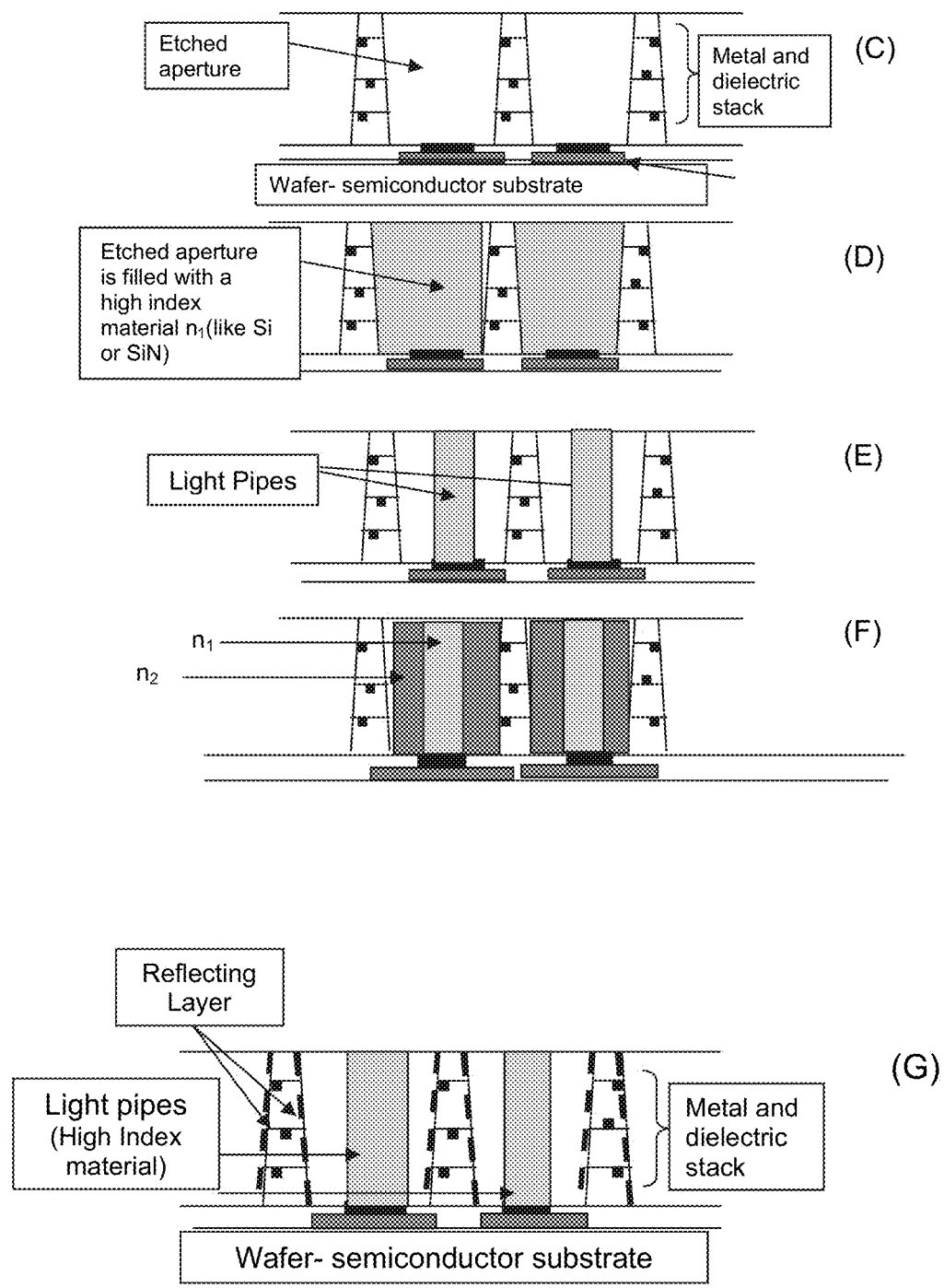
FIG. 5 shows different schematic cross sectional view showing the construction of an embodiment of an image sensor.

FIG. 4 (same as FIG. 5(B)) shows a schematic cross section of an embodiment of a compound pixel having two image sensors having two apertures ($d_1$ and $d_2$) with light pipes for directing light of different wavelengths ($\lambda_B$ and $\lambda_R$). Two photodiodes are constructed under each aperture to capture light of wavelength $\lambda_B$ (or $\lambda_R$) and of the light of wave length $\lambda_{w-B}$ (or $\lambda_{w-R}$). Note that (w) refers to the wavelength of white light. Signals from the 4 photodiodes (located in 2 pixels) are used to construct color.

FIGS. 5(A) to 5(G) show a series of schematic cross-sectional diagrams illustrating the results of progressive stages in fabricating a CMOS image sensor in accordance with an embodiment of the invention. FIG. 5(A) in particular shows a schematic cross-sectional diagram of the CMOS image sensor at an early stage in the fabrication when photodiodes are constructed. The photodiodes are of an area consistent with the area of the light pipes to be fabricated overlying the photodiodes.

FIG. 5(A) shows a semiconductor substrate. The substrate could include a counter-doped well (having a conductivity type different from the semiconductor substrate) is located within the semiconductor substrate (not shown in FIG. 5(A)). A series of isolation regions could also be located within the semiconductor substrate. The semiconductor substrate could comprise a first region R1 that comprises a photoactive region (shown in FIG. 5(A)) and a laterally adjacent second region R2 that comprises a circuitry region (not shown in FIG. 5(A)).

Within the photoactive region R1, the series of isolation regions separates a series of photosensor regions (i.e., the dual photodiodes shown in FIG. 5(A)). Within the circuitry region R2, the series of isolation regions could separate a pair of active regions. The pair of active regions could include a first field effect transistor T1 and a second field effect transistor T2 located and fabricated therein. The field effect transistors T1 and T2 could comprise a pair of CMOS transistors, since transistor T1 could be located and fabricated within the semiconductor substrate and transistor T2 could located and fabricated within the doped well (having different conductivity type than the semiconductor substrate). Finally, there could be a blanket etch stop layer located conformally covering the first region R1 and the second region R2 including the structures that comprise the field effect transistors T1 and T2.

Within both the photoactive region R1 and the circuitry region R2, the series of isolation regions 12 may comprise materials, have dimensions and be formed using methods that are otherwise conventional in the semiconductor fabrication art.

The series of isolation regions may comprise isolation regions including but not limited to local oxidation of silicon (LOCOS) isolation regions, shallow trench isolation regions (i.e., having a depth up to about 5000 angstroms) and deep trench isolation regions (i.e., having a depth up to about 60000 angstroms). Typically, the first embodiment uses shallow trench isolation regions that are located within shallow isolation trenches. The isolation regions (whether located within shallow isolation trenches or deep isolation trenches) may comprise any of several dielectric materials. Typically included are oxides, nitrides and oxynitrides of silicon, as well as laminates thereof and composites thereof. Oxides, nitrides and oxynitrides of other elements are not excluded.

The series of isolation regions could be formed at least in part using a blanket layer deposition and planarizing method. Appropriate blanket layers may be formed using thermal or plasma oxidation or nitridation methods, chemical vapor deposition methods and physical vapor deposition methods. Planarization methods may include, but are not limited to mechanical planarizing methods, and chemical mechanical polish (CMP) planarizing methods. Chemical mechanical polish planarizing methods are most common.

Within the photoactive region R1, each of the series of photosensor regions may comprise photosensors that are otherwise generally conventional in the semiconductor fabrication art. Each of the photosensors typically comprises a photodiode, although the invention is not limited to a photosensor region as only a photodiode. The photodiodes could be doped to a concentration from about 1e(E)16 to about 1e(E)18 dopant atoms per cubic centimeter, while using an appropriate dopant.

Within the circuitry region R2, each of the pair of field effect transistors T1 and T2 could comprise a gate dielectric layer located upon the semiconductor substrate. A gate electrode could be located upon the gate dielectric layer. Spacer layers could be located adjoining the sidewalls of the gate dielectric layer and the gate electrode. Finally, each of the first transistor T1 and the second transistor T2 could comprise a pair of source/drain regions separated by a channel region located beneath the gate electrode.

Each of the foregoing layers and structures that comprise that first transistor T1 and the second transistor T2 may comprise materials and have dimensions that are conventional in the semiconductor fabrication art. Each of the foregoing layers and structures that comprise the first transistor T1 and the second transistor T2 may also be formed using methods that are conventional in the semiconductor fabrication art.

The gate dielectric layers may comprise any of several gate dielectric materials. Included but not limiting are generally lower dielectric constant gate dielectric materials such as but not limited to oxides, nitrides and oxynitrides of silicon having a dielectric constant from about 4 to about 20, measured in vacuum. Also included, and also not limiting, are generally higher dielectric constant gate dielectric materials having a dielectric constant from about 20 to at least about 100. These higher dielectric constant dielectric materials may include, but are not limited to hafnium oxides, hafnium silicates, titanium oxides, barium-strontium titanates (BSTs) and lead-zirconate titanates (PZTs).

The foregoing gate dielectric materials may be formed using methods appropriate to their materials of composition. Non-limiting examples of methods include thermal or plasma oxidation or nitridation methods, chemical vapor deposition methods (including atomic layer chemical vapor deposition methods) and physical vapor deposition methods. Typically, the gate dielectric layers could comprise a thermal silicon oxide gate dielectric material having a thickness from about 20 to about 70 angstroms.

The gate electrodes may similarly also comprise any of several gate electrode conductor materials. Non-limiting examples include certain metals, metal alloys, metal silicides and metal nitrides, as well as doped polysilicon materials (i.e., having a dopant concentration from about 1e18 to about 1e22 dopant atoms per cubic centimeter) and polycide (i.e., doped polysilicon/metal silicide stack) materials. The gate electrode materials may be deposited using any of several methods. Non-limiting examples include chemical vapor deposition methods (also including atomic layer chemical vapor deposition methods) and physical vapor deposition methods. Typically, each of the gate electrodes 18 comprises a doped polysilicon material having a thickness from about 1000 to about 1500 angstroms.

The spacer layers could be typically formed of a dielectric spacer material or a laminate of dielectric spacer materials, although spacer layers formed of conductor materials are also known. Oxides, nitrides and oxynitrides of silicon are commonly used as dielectric spacer materials. Oxides, nitrides and oxynitrides of other elements are not excluded. The dielectric spacer materials may be deposited using methods analogous, equivalent or identical to the methods used for forming the gate dielectric layers. Typically, the spacer layers could be formed using a blanket layer deposition and etchback method that provides the spacer layers with the characteristic inward pointed shape.

The source/drain regions could be formed using a two-step ion implantation method. The source/drain regions could be implanted at a polarity appropriate to a field effect transistor within which they are formed. The two step ion implantation method uses the gate electrode, with and without the spacer layers, as a mask. Typical concentrations of dopants within the source/drain regions could be from about 1c(E)15 to about 1c(E)22 dopant atoms per cubic centimeter.

The blanket etch stop layer may comprise etch stop materials that are conventional in the semiconductor fabrication art. Non-limiting examples also include oxides, nitrides and oxynitrides of silicon. Oxides, nitrides and oxynitrides of other elements are also not excluded. A particular composition of the etch stop layer could be selected in accordance with a composition of materials located and formed thereover. Thus in light of further disclosure below, the blanket etch stop layer could comprise a nitride etch stop material, although the invention is not so limited. The blanket etch stop layer may be formed using any of several methods. Non-limiting examples include chemical vapor deposition or physical vapor deposition methods. Typically, the blanket etch stop layer comprises a silicon nitride material that has a thickness from about 100 to about 300 angstroms.

FIG. 5(B) shows the results of further processing of the CMOS image sensor whose schematic cross-sectional diagram is illustrated in FIG. 5(A). FIG. 5(B) shows dielectric and metal connections stack, patterned and made of materials commonly used in fabricating CMOS sensors.

FIG. 5(B) shows a dielectric and metallization stack layer located upon the CMOS image sensor whose schematic cross-sectional diagram is illustrated in FIG. 5(A). The dielectric and metallization stack layer comprises a series of dielectric passivation layers. Embedded within the series of dielectric passivation layers includes interconnected metallization layers. Components for the interconnected metallization layers include, but are not limited to contact studs CA, first interconnection layers M1, first interconnection studs V1, second interconnection layers M2, second interconnection studs V2, third interconnection layers M3, terminal interconnection studs V3 and terminal metallization layers M4. One interconnected metallization layer could be connected to a source/drain region of transistor T1 and another interconnected metallization layer could be connected to a source/drain region of transistor T2. A pair of first interconnection layers M1, a pair of second interconnection layers M2 and a pair of third interconnection layers M3 is also located remotely within the photosensor region R1, but still embedded within the dielectric and metallization stack layer shown in FIG. 5(B).

The individual metallization interconnection studs and metallization interconnection layers CA, M1, V1, M2, V2, M3, V3 and M4 that could be used within the interconnected metallization layers may comprise any of several metallization materials that are conventional in the semiconductor fabrication art. Non-limiting examples include certain metals, metal alloys, metal nitrides and metal silicides. Most common are aluminum metallization materials and copper metallization materials, either of which often includes a barrier metallization material, as discussed in greater detail below. Types of metallization materials may differ as a function of size and location within a semiconductor structure. Smaller and lower-lying metallization features typically comprise copper containing conductor materials. Larger and upper-lying metallization features typically comprise aluminum containing conductor materials.

The series of dielectric passivation layers the stack may also comprise any of several dielectric materials that are conventional in the semiconductor fabrication art. Included are generally higher dielectric constant dielectric materials having a dielectric constant from 4 to about 20. Non-limiting examples that are included within this group are oxides, nitrides and oxynitrides of silicon. The series of dielectric layers may also comprise generally lower dielectric constant dielectric materials having a dielectric constant from about 2 to about 4. Included but not limiting within this group are hydrogels, aerogels, silsesquioxane spin-on-glass dielectric materials, fluorinated glass materials and organic polymer materials.

The dielectric and metallization stack layer could comprise interconnected metallization layers and discrete metallization layers M1, M2 and M3 comprising at least one of copper metallization materials and aluminum metallization materials. The dielectric and metallization stack layer may also comprise dielectric passivation layers that also comprise at least one of the generally lower dielectric constant dielectric materials disclosed above. The dielectric and metallization stack layer could have an overall thickness from about 1 to about 4 microns (µm). It may typically comprise from about 2 to about 4 discrete horizontal dielectric and metallization component layers within a stack.

FIG. 5(C) shows a schematic cross-sectional diagram illustrating the results of further processing of the CMOS image sensor whose schematic cross-sectional diagram is illustrated in FIG. 5(B).

FIG. 5(C) shows the results of patterning the dielectric and metallization stack layer to form a patterned dielectric and metallization stack layer that comprises a series of patterned dielectric passivation layers. The patterned dielectric and metallization stack layer has a series of apertures A1 and A2 located therein and registered with the series of photosensor regions.

The patterned dielectric and metallization stack layer may be patterned from the dielectric and metallization stack layer while using methods and materials that are conventional in the semiconductor fabrication art, and appropriate to the materials from which are formed the series of dielectric passivation layers. The dielectric and metallization stack layer may be patterned using wet chemical etch methods, dry plasma etch methods or aggregate methods thereof. Dry plasma etch methods are generally preferred insofar as they provide enhanced sidewall profile control when forming the series of patterned dielectric and metallization stack layer. As is illustrated in FIG. 5(C), the dielectric and metallization stack layer could be patterned to form the patterned dielectric and metallization stack layer while using an etch stop layer as a stop layer.

FIG. 5(D) shows the results of further processing of the CMOS image sensor whose schematic cross-sectional diagram is illustrated in FIG. 5(C).

FIG. 5(D) shows the apertures are filled with materials of high light index of refraction (n1). Optionally, in one embodiment, a reflective layer having a reflective surface conformally and contiguously lining each of the apertures A1 and A2, including the bottoms and sidewalls thereof, and also conformally and contiguously covering top surfaces of the patterned dielectric and metallization stack layer could be formed. The reflective layer could also passivate a terminal metal layer M4.

Dielectric materials within the series of patterned dielectric and metallization stack layer typically have dielectric constants from about 1.4 to about 1.6 (e.g., when comprised of silicon oxide). Aperture fill materials of high light refraction (n1) could have a dielectric constant from about 1.6 to about 2.1. A silicon nitride dielectric material typically has a dielectric constant from about 2.0 to about 2.1, and could be used for forming the high light refraction material filling apertures, but the embodiment is not so limited.

FIG. 5(E) shows the results of further processing of the CMOS image sensor whose schematic cross-sectional diagram is illustrated in FIG. 5(D). Specifically, FIG. 5(E) shows the results of patterning the high light refraction material in apertures A1 and A2 such that material is removed to leave a light pipe structure of high light index of refraction (n1). The foregoing patterning may be implemented using methods and materials that are conventional in the art. Non-limiting examples include wet chemical etch methods and materials, dry plasma etch methods and materials, and aggregate methods and materials thereof. Alternate methods are not excluded.

FIG. 5(F) shows the results of further processing of the CMOS image sensor whose schematic cross-sectional diagram is illustrated in FIG. 5(E). Specifically, FIG. 5(F) shows that the volume around the light pipe is filled with material of index of refraction (n2<n1). Optionally, in one embodiment, it is also possible to leave this volume unfilled.

Optionally, in one embodiment, a planarizing layer could be located upon the reflective layer and/or above filled apertures. The planarizing layer may comprise any of several optically transparent planarizing materials. Non-limiting examples include spin-on-glass planarizing materials and organic polymer planarizing materials. The planarizing layer could have a thickness sufficient to at least planarize the series of apertures A1 and A2, thus providing a planar surface for fabrication of additional structures within the CMOS image sensor.

FIG. 5(G) shows the embodiment in which a reflective layer could be deposited on the stack as discussed above such that the sidewalls of the aperture with the reflective layer. The reflective layer can enhance the light collection efficiency of the image sensor.

Optionally, a series of color filter layers could be located upon the patterned on the apertures. The color filter layers would be registered with respect to the photosensor regions. The series of color filter layers could typically include either the primary colors of red, green and blue, or the complementary colors of yellow, cyan and magenta. The series of color filter layers could comprise a series of dyed or pigmented patterned photoresist layers that are intrinsically imaged to form the series of color filter layers. Alternatively, the series of color filter layers may comprise dyed or pigmented organic polymer materials that are otherwise optically transparent, but extrinsically imaged while using an appropriate mask layer. Alternative color filter materials may also be used.

Figure 6:
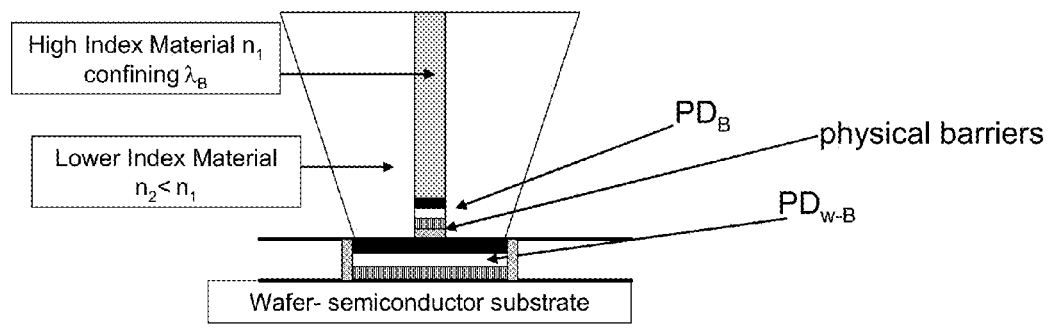
FIG. 6 shows a schematic cross sectional view of an embodiment of a dual photodiode comprising a first photodiode having substantially the same a cross sectional area as of the optical pipe is located beneath the optical pipe and a second photodiode having substantially the same or greater cross sectional areas than that of the aperture in the stack is located under the first photodiode, and wherein the first photodiode and the second photodiode are separated by a physical barrier to prevent cross talk.

FIG. 6 shows an embodiment of a dual photodiode under each aperture. Preferably, under each aperture there are 2 photodiodes $PD_B$ (or $PD_R$) and $PD_{W-B}$ (or $PD_{W-R}$). Each photodiode captures charge carriers excited by light of different wavelengths: $\lambda_B$ (or $\lambda_R$) and $\lambda_{w-B}$ (or $\lambda_{w-R}$). The topology of the two photodetectors (photodiodes) is such that the carriers from different regions of the spectrum do not cross talk. This can be accomplished by creating physical barriers such as trenches or by doping to form high resistive areas.

To achieve the good light detection, it is desirable to create a good coupling of light to the photodiode. In one embodiment, this can be achieved by placing a microlens on top of the pixel, or creating a monolithic coupler. No color filter may be used in the embodiments of the image sensor with or without the microlens or optionally, as explained above, color filter could also be used in the embodiments of the sensor with or without the microlens.

Figure 7:
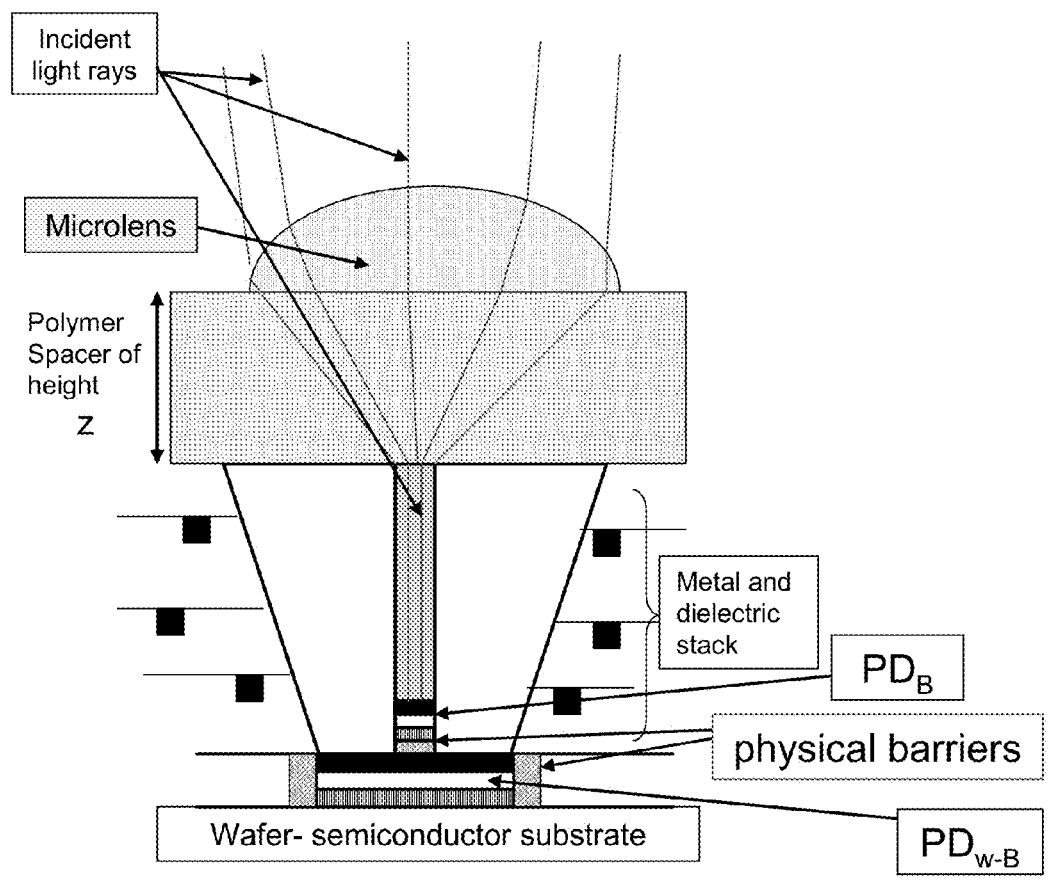
FIG. 7 shows a schematic cross sectional view of an embodiment of a light coupler optically coupled to an image sensor.

The microlens should to be placed at the appropriate height such as the light is preferably focused on top of the light pipe. FIG. 7 shows a schematic of the microlens positioned at the optimum distance (z) by using a polymeric layer of certain thickness as a spacer. Light is then focused on top of the light pipe which then directs it to the photodiode. Microlens in this embodiment could be created using the standard method used for CMOS sensors.

Figure 8:
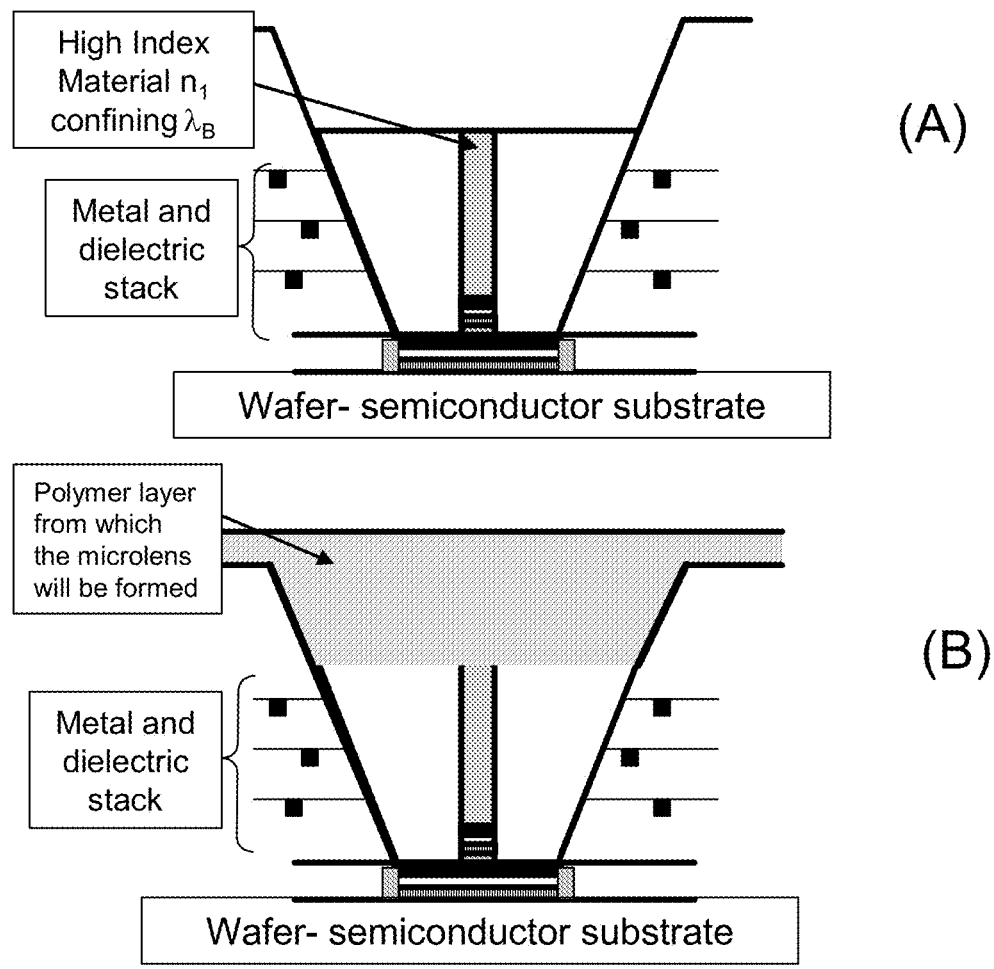
FIG. 8 shows different schematic cross sectional views showing the construction of an embodiment of a light coupler optically coupled to an image sensor. The top and bottom figures are cross sections of two complementary pixels (2 pipe lights of different diameters) that create color.
Figure 8:
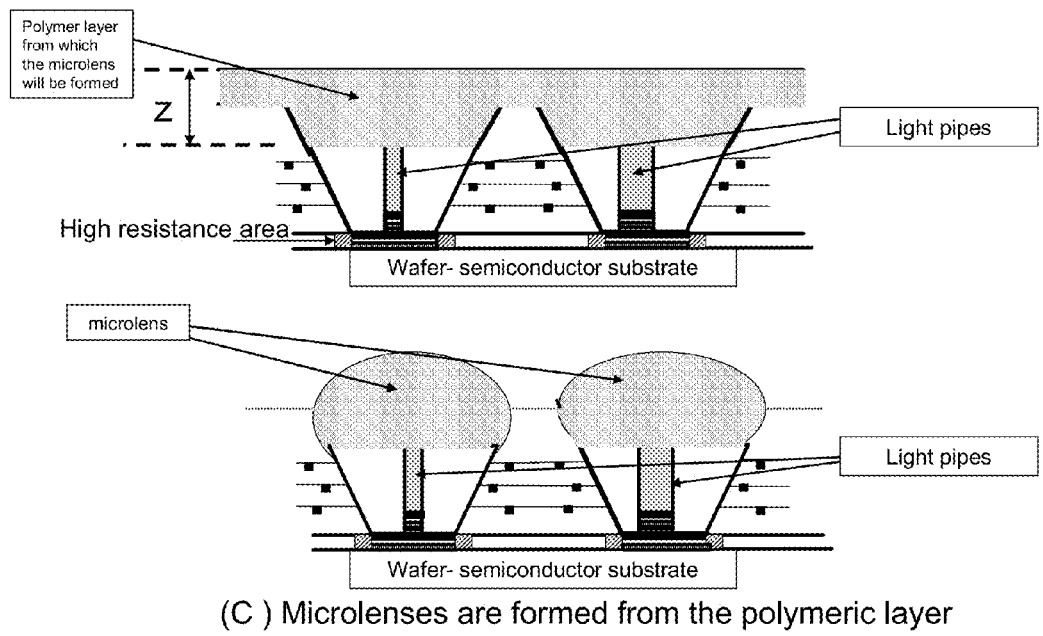

FIG. 8(A) to (C) show a monolithic coupling structure that can be formed by filling the lens material in a deeper etch. FIG. 8(A) shows that the apertures have a deeper etch, and the light pipe does not extend to the top of the structure. FIG. 8(B) shows the area on top of the light pipe is filled with a polymer of the appropriate surface tension and viscosity to form lens in the normal process used to form microlenses. FIG. 8(C)(top) shows a plurality of the monolithic coupling structures and FIG. 8(C)(bottom) shows a plurality of microlenses patterned on a plurality of light pipe aperatures.

The microlenses of the embodiments of the image sensor may comprise any of several optically transparent lens materials that are known in the art. Non-limiting examples include optically transparent inorganic materials, optically transparent organic materials and optically transparent composite materials. Most common could be optically transparent organic materials. The microlens layer could be formed incident to patterning and reflow of an organic polymer material that has a glass transition temperature lower than the series of color filter layers (if present) or the patterned planarizing layer (which is generally present in the embodiments of the image sensors).

The recognition of color and luminance by the embodiments of the image sensors could be done by color reconstruction. Each compound pixel has complete luminance information obtained by combining its two complementary outputs. As a result, the same image sensor can be used either as a full resolution black and white or full color sensor.

The color reconstruction could be done to obtain full color information by the appropriate combination of two adjacent pixels, which could be one embodiment of a compound pixel, either horizontally or vertically. The support over which color information is obtained is less than the dimension of two pixels as opposed to 4 for the Bayer pattern.

Figure 9:
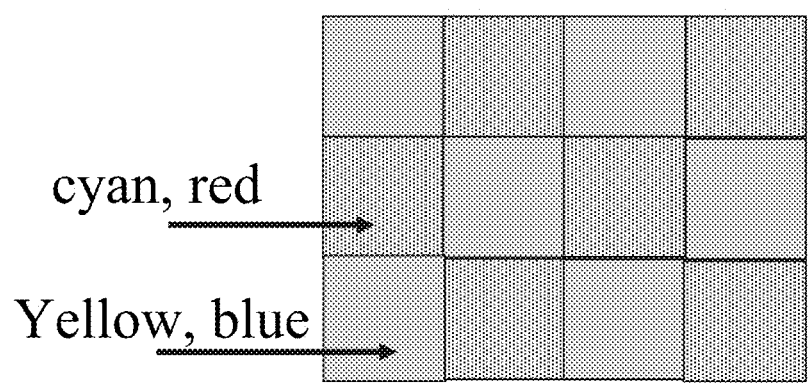
FIG. 9 shows a schematic of a top view of a device containing image sensors of the embodiments disclosed herein, each image sensor having two outputs representing the complementary colors.

Each physical pixel of a device containing an image sensor of the embodiments disclosed herein would have two outputs representing the complementary colors, e.g., cyan, red (C, R) designated as output type 1 or yellow, blue (Y, B) designated as output type 2 as shown in FIG. 9. These four outputs of two pixels of a compound pixel can be resolved to reconstruct a full color scene of an image viewed by a device containing the image sensors of the embodiments described herein.

The foregoing detailed description has set forth various embodiments of the devices and/or processes via the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to optical coupling to permit transmission of optical light, for example via an optical pipe or fiber, physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

I claim:

1. An image sensor comprising an optical pipe, wherein the image sensor is configured to separate an electromagnetic radiation incident on the image sensor at a cutoff wavelength between selected wavelengths and non-selected wavelengths by selectively transmitting selected wavelengths through the optical pipe;
    wherein the optical pipe comprises nested optical pipes and a portion of the optical pipe is configured to transmit electromagnetic radiation at the selected wavelengths.

2. The image sensor of claim 1, wherein the optical pipe comprises a core and a cladding.

3. The image sensor of claim 2, wherein the core comprises a first photosensor.

4. The image sensor of claim 3, further comprising a second photosensor coupled to the cladding.

5. The image sensor of claim 2, wherein the core has a core index of refraction ($n_1$), the cladding has a cladding index of refraction ($n_2$), and further wherein $n_1 > n_2$.

6. The image sensor of claim 2, wherein the optical pipe is configured to separate wavelengths of an electromagnetic radiation incident on the image sensor at a cutoff wavelength through the core and the cladding.

7. The image sensor of claim 4, wherein the second photosensor is located on or within a substrate.

8. The image sensor of claim 1, further comprising a lens structure or an optical coupler over the optical pipe, wherein the lens structure or the optical coupler is operably coupled to the optical pipe.

9. The image sensor of claim 2, wherein the core comprises a first waveguide.

10. The image sensor of claim 2, wherein the cladding comprises a second waveguide.

11. The image sensor of claim 2, further comprising a stack surrounding the optical pipe, the stack comprising metallic layers embedded in dielectric layers.

12. The image sensor of claim 11, wherein a surface of the stack comprises a reflective surface.

13. The image sensor of claim 2, wherein the image sensor is a complementary metal oxide semiconductor (CMOS) image sensor.

14. The image sensor of claim 11, wherein the core has a core index of refraction ($n_1$), the cladding has a cladding index of refraction ($n_2$), and the stack has a stack refractive index ($n_3$), and further wherein $n_1 > n_2 > n_3$.

15. The image sensor of claim 3, wherein the first photosensor comprises a photodiode.

16. An image sensor comprising an optical pipe, wherein the image sensor is configured to separate an electromagnetic radiation incident on the image sensor at a cutoff wavelength between selected wavelengths and non-selected wavelengths by selectively transmitting selected wavelengths through the optical pipe, wherein the optical pipe comprises nested optical pipes and is configured not to transmit electromagnetic radiation at the non-selected wavelengths and the optical pipe does not substantially absorb electromagnetic radiation at non-selected wavelengths.

17. The image sensor of claim 16, wherein the optical pipe comprises a core and a cladding.

18. The image sensor of claim 17, wherein the core comprises a first photosensor.

19. The image sensor of claim 18, further comprising a second photosensor coupled to the cladding.

20. The image sensor of claim 17, wherein the core has a core index of refraction ($n_1$), the cladding has a cladding index of refraction ($n_2$), and further wherein $n_1 > n_2$.

21. The image sensor of claim 17, wherein the optical pipe is configured to separate wavelengths of an electromagnetic radiation incident on the image sensor at a cutoff wavelength through the core and the cladding.

22. The image sensor of claim 19, wherein the second photosensor is located on or within a substrate.

23. The image sensor of claim 16, further comprising a lens structure or an optical coupler over the optical pipe, wherein the lens structure or the optical coupler is operably coupled to the optical pipe.

24. The image sensor of claim 17, wherein the core comprises a first waveguide.

25. The image sensor of claim 17, wherein the cladding comprises a second waveguide.

26. The image sensor of claim 17, further comprising a stack surrounding the optical pipe, the stack comprising metallic layers embedded in dielectric layers.

27. The image sensor of claim 26, wherein a surface of the stack comprises a reflective surface.

28. The image sensor of claim 17, wherein the image sensor is a complementary metal oxide semiconductor (CMOS) image sensor.

29. The image sensor of claim 26, wherein the core has a core index of refraction ($n_1$), the cladding has a cladding index of refraction ($n_2$), and the stack has a stack refractive index ($n_3$), and further wherein $n_1 > n_2 > n_3$.

30. The image sensor of claim 18, wherein the first photosensor comprises a photodiode.

* * * * *